US008110509B2

(12) United States Patent
Yamazaki et al.

(10) Patent No.: US 8,110,509 B2
(45) Date of Patent: Feb. 7, 2012

(54) METHOD OF FABRICATING LIGHT EMITTING DEVICES

(75) Inventors: Shunpei Yamazaki, Tokyo (JP); Masakazu Murakami, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 12/203,802

(22) Filed: Sep. 3, 2008

(65) Prior Publication Data
US 2009/0075411 A1    Mar. 19, 2009

Related U.S. Application Data

(62) Division of application No. 10/438,194, filed on May 15, 2003, now abandoned.

(30) Foreign Application Priority Data

May 17, 2002    (JP) .................................. 2002-143803

(51) Int. Cl.
    *H01L 21/302*    (2006.01)
(52) U.S. Cl. ................... 438/780; 438/908; 414/935
(58) Field of Classification Search .................. 438/780, 438/908; 414/938–941
    See application file for complete search history.

(56) References Cited

U.S. PATENT DOCUMENTS

| | | |
|---|---|---|
| 2,435,997 A | 2/1948 | Bennett |
| 3,312,190 A | 4/1967 | Bradshaw |
| 3,931,490 A | 1/1976 | Grothe et al. |
| 3,971,334 A | 7/1976 | Pundsack |
| 4,023,523 A | 5/1977 | Ing |
| 4,187,801 A | 2/1980 | Monk |
| 4,451,499 A | 5/1984 | Morimoto et al. |
| 4,543,467 A | 9/1985 | Eisele et al. |
| 4,627,989 A | 12/1986 | Feuerstein et al. |
| 4,854,264 A | 8/1989 | Noma et al. |
| 4,885,211 A | 12/1989 | Tang et al. |
| 4,897,290 A | 1/1990 | Terasaka et al. |
| 5,258,325 A | 11/1993 | Spitzer et al. |

(Continued)

FOREIGN PATENT DOCUMENTS

EP    0 271 351 A2    6/1988

(Continued)

OTHER PUBLICATIONS

Office Action issued Mar. 20, 2007 in counterpart Taiwan Patent Application No. 92113515.

(Continued)

*Primary Examiner* — Charles Garber
*Assistant Examiner* — Reema Patel
(74) *Attorney, Agent, or Firm* — Nixon Peabody LLP; Jeffrey L. Costellia

(57) ABSTRACT

A manufacturing apparatus is provided, which can improve a utilization efficiency of an evaporation material, reduce manufacturing costs of a light emitting device having an organic light emitting element, and shorten manufacturing time necessary to manufacture a light emitting device. According to the present invention, a multi-chamber manufacturing apparatus having plural film forming chambers includes a first film forming chamber for subjecting a first substrate to evaporation and a second film forming chamber for subjecting a second substrate to evaporation. In each film forming chamber, plural organic compound layers are laminated, thereby improving the throughput. Further, it is possible that the respective substrates in the plural film forming chambers are subjected to evaporation in the same manner in parallel, while another film forming chamber undergoes cleaning.

12 Claims, 23 Drawing Sheets

U.S. PATENT DOCUMENTS

| | | | |
|---|---|---|---|
| 5,429,884 A | 7/1995 | Namiki et al. |
| 5,695,564 A | 12/1997 | Imahashi |
| 5,817,366 A | 10/1998 | Aria et al. |
| 6,001,413 A | 12/1999 | Matsuura et al. |
| 6,049,167 A | 4/2000 | Onitsuka et al. |
| 6,132,280 A | 10/2000 | Tanabe et al. |
| 6,179,923 B1 | 1/2001 | Yamamoto et al. |
| 6,202,591 B1 | 3/2001 | Witzman et al. |
| 6,237,529 B1 | 5/2001 | Spahn |
| 6,244,212 B1 | 6/2001 | Takacs et al. |
| 6,326,726 B1 | 12/2001 | Mizutani et al. |
| 6,329,229 B1 | 12/2001 | Yamazaki et al. |
| 6,331,212 B1 | 12/2001 | Mezey, Sr. |
| 6,356,032 B1 * | 3/2002 | Suzuki et al. ............ 315/169.3 |
| 6,364,956 B1 | 4/2002 | Wang et al. |
| 6,367,414 B2 | 4/2002 | Witzman et al. |
| 6,382,895 B1 | 5/2002 | Konishi et al. |
| 6,383,402 B1 | 5/2002 | Smith, Jr. et al. |
| 6,391,114 B1 | 5/2002 | Kirimura |
| 6,403,392 B1 | 6/2002 | Burrows et al. |
| 6,482,752 B1 | 11/2002 | Yamazaki et al. |
| 6,513,451 B2 * | 2/2003 | Van Slyke et al. ...... 118/723 VE |
| 6,641,674 B2 | 11/2003 | Peng |
| 7,342,355 B2 | 3/2008 | Seo et al. |
| 7,651,722 B2 | 1/2010 | Mori et al. |
| 2001/0005553 A1 | 6/2001 | Witzman et al. |
| 2001/0006827 A1 | 7/2001 | Yamazaki et al. |
| 2001/0009154 A1 | 7/2001 | Nguyen et al. |
| 2001/0021455 A1 | 9/2001 | Witzman et al. |
| 2001/0022272 A1 | 9/2001 | Plester et al. |
| 2002/0009538 A1 | 1/2002 | Arai |
| 2002/0011205 A1 | 1/2002 | Yamazaki et al. |
| 2002/0081372 A1 | 6/2002 | Peng |
| 2002/0197760 A1 | 12/2002 | Yamazaki et al. |
| 2003/0000645 A1 * | 1/2003 | Dornfest ................. 156/345.32 |
| 2003/0162314 A1 | 8/2003 | Yamazaki et al. |
| 2003/0194484 A1 | 10/2003 | Yamazaki et al. |
| 2004/0168634 A1 | 9/2004 | Mori et al. |
| 2010/0021624 A1 | 1/2010 | Yamazaki et al. |

FOREIGN PATENT DOCUMENTS

| | | |
|---|---|---|
| EP | 0 865 229 A2 | 9/1998 |
| EP | 0 998 170 A2 | 5/2000 |
| EP | 1 033 750 A1 | 9/2000 |
| EP | 1 113 087 A2 | 7/2001 |
| JP | 54-127877 | 10/1979 |
| JP | 55-036924 | 3/1980 |
| JP | 56-020163 | 2/1981 |
| JP | 63-149371 | 6/1988 |
| JP | 01-060546 | 12/1989 |
| JP | 03-197668 | 8/1991 |
| JP | 05-230627 | 9/1993 |
| JP | 07-126838 | 5/1995 |
| JP | 08-222518 | 8/1996 |
| JP | 10-025563 | 1/1998 |
| JP | 10-041069 | 2/1998 |
| JP | 10-324966 | 12/1998 |
| JP | 11-126686 | 5/1999 |
| JP | 2000-133446 | 5/2000 |
| JP | 2000-315576 | 11/2000 |
| JP | 2001-059161 | 3/2001 |
| JP | 2001-093667 | 4/2001 |
| JP | 2001-152336 | 6/2001 |
| JP | 2001-234335 | 8/2001 |
| JP | 2001-247959 | 9/2001 |
| JP | 2002-367781 | 12/2002 |
| JP | 2003-502494 | 1/2003 |
| JP | 2003-034591 | 2/2003 |
| JP | 2003-095787 | 4/2003 |
| JP | 2004-035964 | 2/2004 |
| KR | 1998-0080038 | 11/1998 |
| KR | 2000-0034932 | 6/2000 |
| WO | WO 98/54375 | 12/1998 |
| WO | WO 00/28103 A2 | 5/2000 |
| WO | WO 01/31081 A1 | 5/2001 |

OTHER PUBLICATIONS

Office Action dated Nov. 21, 2006 in counterpart Taiwan Patent Application Serial No. 92113515.

Tang et al., "Organic Electroluminescent Diodes," Appl. Phys. Lett. (Applied Physics Letters) vol. 51, No. 12, pp. 913-915, Sep. 21, 1987.

Fukuda et al., "An Organic LED Display Exhibiting Pure RGB Colors," Synthetic Metals, vol. 111-112, pp. 1-6, Jan. 1, 2000.

Office Action (Application No. 2003-0031165;KR06432) Dated Apr. 12, 2010.

* cited by examiner

X-direction Cross Section

Y-direction Cross Section

Plane View

Plane View

Perspective View

Plane View

Perspective View

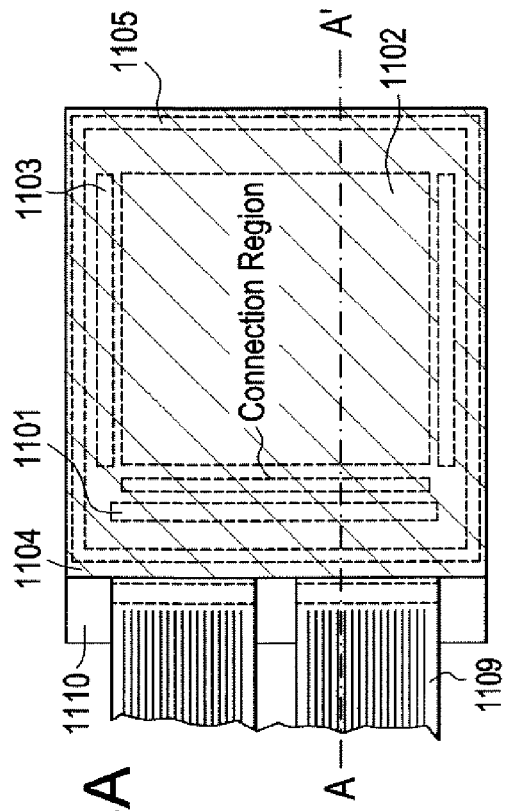
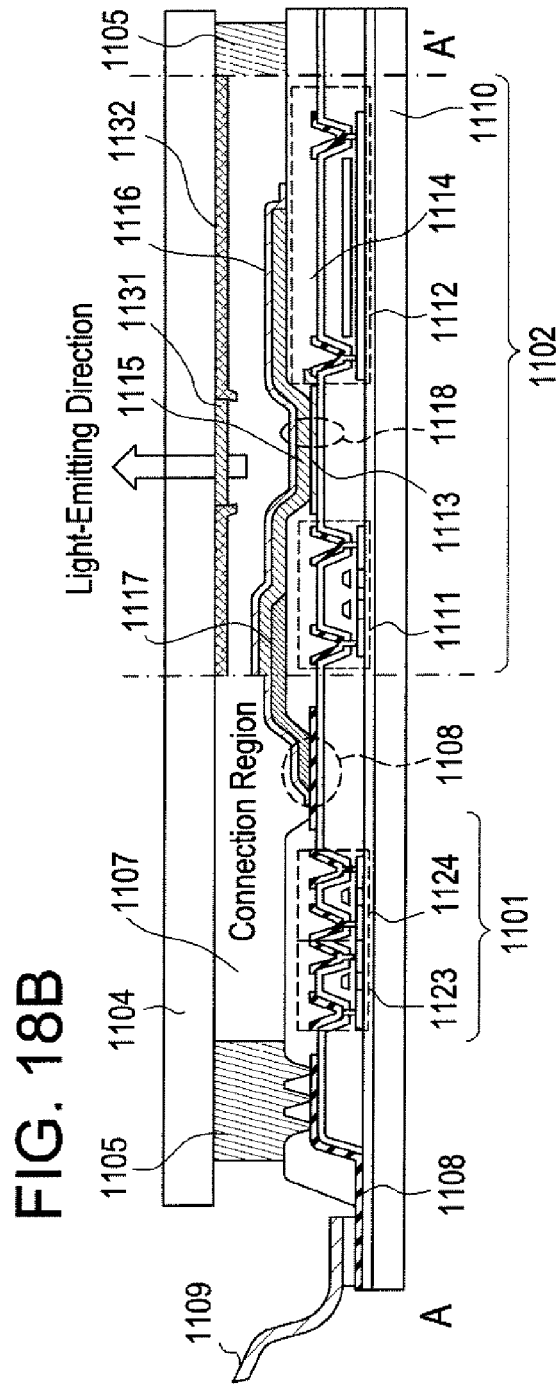
FIG. 18A
FIG. 18B

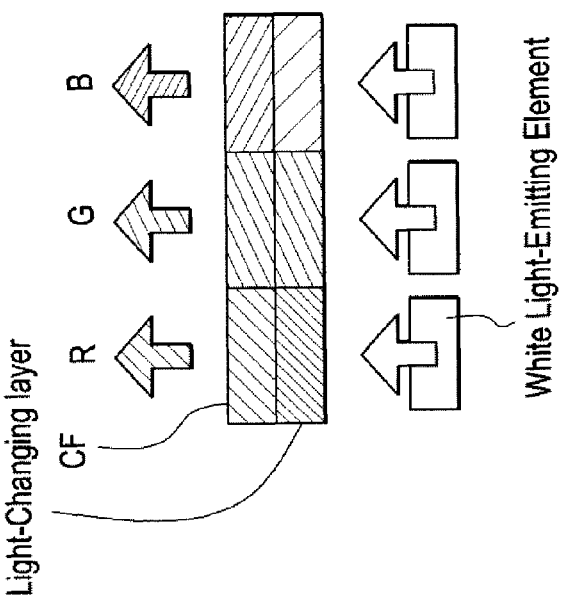
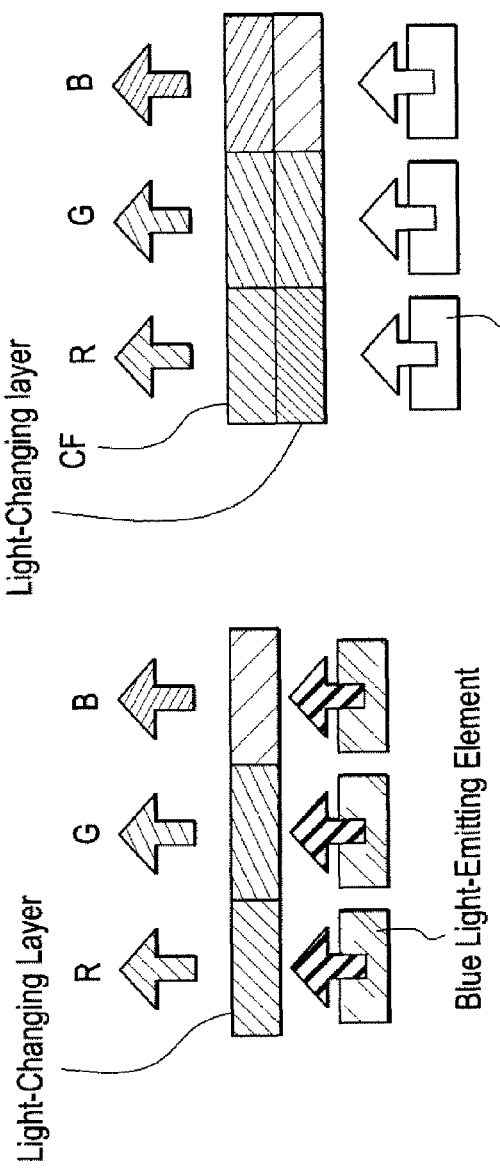
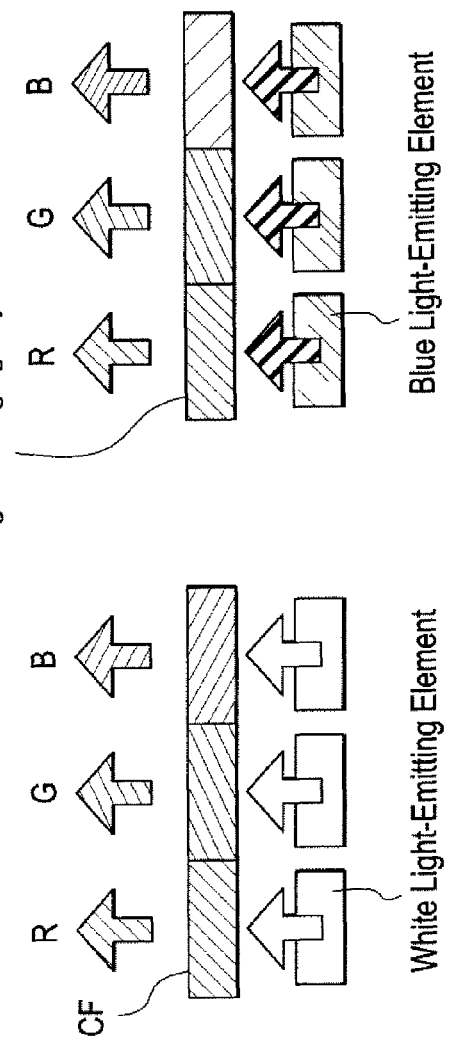

METHOD OF FABRICATING LIGHT EMITTING DEVICES

BACKGROUND OF THE INVENTION

1. Field of the Invention

The present invention relates to a manufacturing apparatus used for film formation of a material that can be formed into a film by evaporation (hereinafter referred to as evaporation material) and a manufacturing method of a light emitting device typified by an EL element. In particular, the present invention relates to a technique using an organic material as the evaporation material and being effective when manufacturing a light emitting device. Note that the term "light emitting device" in this specification refers to an image display device, a light emitting device, or a light source (including illuminating devices). Also included in the definition of the light emitting device are: a module in which a connector such as an FPC (flexible printed circuit), a TAB (tape automated bonding) tape, or a TCP (tape carrier package) is attached to a light emitting device; a module in which a printed wiring board is provided on the tip of a TAB tape or a TCP; and a module in which an IC (integrated circuit) is mounted directly to a light emitting element by a COG (chip on glass) method.

2. Description of the Related Art

In recent years, the research of light emitting devices using an EL element as a self-luminous element has become active. In particular, light emitting devices using an organic material as an EL material are attracting more attention. The light emitting devices are called organic EL displays (OELD) or organic light emitting diodes (OLED).

Note that an EL element has a layer (hereinafter referred to as EL layer) containing an organic compound in which luminescence developed by applying an electric field (electroluminescence) is obtained, an anode, and a cathode. The types of the organic compound luminescence includes light emission when returning from a singlet excitation state to a ground state (fluorescence) and light emission when returning from a triplet excitation state to a ground state (phosphorescence). Both types of light emission can be applied to a light emitting device produced by a film forming apparatus and a film formation method according to the present invention.

Unlike liquid crystal display devices, light emitting devices are of a self-luminous type, thereby causing no problem of a view angle. More specifically, the light emitting devices are more suitable as a display used outside than the liquid crystal displays. Thus, the use of the light emitting devices in various forms has been proposed.

An EL element has a structure in which an EL layer is sandwiched between a pair of electrodes, and the EL layer normally has a laminate structure. A typical example of the laminate structure is one composed of "a hole transporting layer/a light emitting layer/and an electron transporting layer". Most of the light emitting devices currently under research and development adopt the structure due to its extremely high light emitting efficiency.

Alternatively, another laminate structure may be used in which: a hole injecting layer, a hole transporting layer, a light emitting layer, and an electron transporting layer are laminated onto an anode in the stated order; or a hole injecting layer, a hole transporting layer, a light emitting layer, an electron transporting layer, and an electron injecting layer are laminated onto an anode in the stated order. Fluorescent pigments and the like may also be doped into the light emitting layers. Further, all of the above layers may be formed using only low-molecular weight materials, or may be formed using only high-molecular weight materials.

Further, EL materials used to form an EL layer are broadly divided into low-molecular weight (monomer-based) materials and high-molecular weight (polymer-based) materials, while the low-molecular weight materials are formed into films mainly by evaporation.

The EL material is extremely likely to deteriorate, because the EL material is easily oxidized due to presence of oxygen or moisture. Thus, a photolithography step cannot be performed after film formation. In order to form a pattern, it is necessary to use a mask (hereinafter referred to as evaporation mask) having an opening portion to separate out the pattern region at the same time of the film formation. Therefore, most of the sublimated organic EL materials are adhered to an inner wall of a film forming chamber or an adhesion proof shield (protective plate for preventing an evaporation material from adhering to the inner wall of the film forming chamber). As a result, an evaporation apparatus needs regular maintenance such as a cleaning process for removing adhered substances from the inner wall of the film forming chamber and the adhesion proof shield, thereby making it inevitable to temporarily stop a manufacturing line for mass production during the maintenance.

In order to improve uniformity of a film thickness, conventional evaporation apparatuses have a larger interval between a substrate and an evaporation source, so that the apparatuses per se have a larger size. Also, the conventional evaporation apparatuses have a structure, as shown in FIG. 22, in which the interval between a substrate and an evaporation source is set to 1 m or more and the substrate is rotated to obtain a film having a uniform thickness. Further, the evaporation apparatuses have such a structure as to rotate the substrate, so that there is a limitation on an evaporation apparatus for attaining a large-area substrate. Also, the interval between a substrate and an evaporation source is large, so that a speed of film formation is reduced and a longer time is necessary to exhaust a film forming chamber, thereby reducing the throughput.

In addition, in the conventional evaporation apparatuses, the utilization efficiency of an expensive EL material is as extremely low as approximately 1% or low. Thus, the manufacturing costs of a light emitting device are extremely high.

An EL material is extremely expensive and costs higher per gram than gold costs per gram. Therefore it is desired to use an EL material as efficiently as possible. However, in the conventional evaporation apparatuses, the utilization efficiency of the expensive EL material is low.

SUMMARY OF THE INVENTION

The present invention has been made in view of the above, and therefore has an object to provide an evaporation apparatus and a manufacturing apparatus, which are capable of improving a utilization efficiency of an EL material, excellent in uniformity, and excellent in throughput.

Due to evaporation being performed in vacuum, it takes a long time to set an inside of a film forming chamber to vacuum and a time necessary for each step differs in every film forming chamber. Thus, it is difficult to design manufacturing processes as automated steps, thereby putting a limitation on improvement in productivity. In particular, it takes a long time to deposit and laminate layers containing an organic compound by evaporation, so that there is a limitation on reduction in a processing time per substrate. In view of the above, the present invention has another object to reduce a processing time per substrate.

Further, another object of the present invention is to provide a manufacturing apparatus capable of maintenance of a film forming chamber without temporarily stopping a manufacturing line.

Further, according to the present invention, there is provided a method of depositing an EL material by evaporation efficiently on a large-area substrate having a size such as 320 mm×400 mm, 370 mm×470 mm, 550 mm×650 mm, 600 mm×720 mm, 680 mm×880 mm, 1000 mm×1200 mm, 1100 mm×1250 mm, or 1150 mm×1300 mm.

Further, according to the present invention, there is provided a manufacturing system capable of preventing impurities from mixing into an EL material.

According to the present invention, there is provided a multi-chamber manufacturing apparatus having plural film forming chambers, including a first film forming chamber for subjecting a first substrate to evaporation and a second film forming chamber for subjecting a second substrate to evaporation, characterized in that plural organic compound layers are laminated in respective film forming chambers in parallel, thereby reducing a processing time per substrate. More specifically, after the first substrate is loaded from a transfer chamber into the first film forming chamber, a surface of the first substrate is subjected to evaporation, while after the second substrate is loaded from the transfer chamber into the second film forming chamber, a surface of the second substrate is also subjected to evaporation. In FIG. 1, four film forming chambers are connected to a transfer chamber 102. Therefore, as shown in FIG. 6A showing an example of a sequence from loading of substrates to unloading of the substrates, it is possible that four substrates are loaded into the respective film forming chambers and sequentially subjected to evaporation in parallel.

According to the present invention, in order to maintain uniform cycle times during mass production, plural chambers are provided at least as evaporation chambers and heating chambers, and a single chamber may be provided as another chamber having a relatively short processing time. Accordingly, the present invention allows efficient mass production.

According to a first structure of the present invention disclosed in this specification, there is provided a manufacturing apparatus, including:

a load chamber;
a transfer chamber that is connected to the load chamber; and
plural film forming chambers that are connected to the transfer chamber, wherein:
the plural film forming chambers are each connected to a vacuum-exhaust process chamber for setting an inside of the film forming chamber to vacuum, and each include: alignment means for performing position alignment of a mask and a substrate; an evaporation source; and means for heating the evaporation source; and
in at least two of the plural film forming chambers, surfaces of substrates loaded into the respective film forming chambers are subjected to evaporation in parallel.

Further, not only the film forming chambers in which an organic compound layer is formed but also the film forming chambers, sealing chambers, and pretreatment chambers in which electrodes (cathodes or anodes) are formed on the organic compound layer may be provided in plural number, respectively, and the respective forming processes may be performed in parallel similarly. Therefore, according to a second structure of the present invention disclosed in this specification, there is provided a manufacturing apparatus, including:

a load chamber;
a transfer chamber that is connected to the load chamber;
plural film forming chambers that are connected to the transfer chamber, and
plural sealing chambers, wherein:
the plural film forming chambers are each connected to a vacuum-exhaust process chamber for setting an inside of the film forming chamber to vacuum, and each include: alignment means for performing position alignment of a mask and a substrate; an evaporation source; and means for heating the evaporation source;
in at least two of the plural film forming chambers, surfaces of substrates loaded into the respective film forming chambers are subjected to evaporation in parallel; and
each substrate is assigned to one of the plural sealing chambers to be sealed therein.

Further, according to the present invention, even though the processing number of substrates is slightly reduced, the effective evaporation process can be realized. For example, as shown in FIG. 6B showing an example of a sequence from loading of substrates to unloading of the substrates, even when a fourth film forming chamber is undergoing the maintenance, evaporation can be performed in first to third film forming chambers sequentially without temporarily stopping the production line. Therefore, according to a third structure of the present invention disclosed in this specification, there is provided a manufacturing apparatus, including:

a load chamber;
a transfer chamber that is connected to the load chamber; and
plural film forming chambers that are connected to the transfer chamber, wherein:
the plural film forming chambers are each connected to a vacuum-exhaust process chamber for setting an inside of the film forming chamber to vacuum, and each include: alignment means for performing position alignment of a mask and a substrate; an evaporation source; and means for heating the evaporation source; and
in at least two of the plural film forming chambers, surfaces of substrates loaded into the respective film forming chambers are subjected to evaporation in parallel, and in at least one of the plural film forming chambers, the inside of the film forming chamber undergoes cleaning.

Further, in the case of forming a single-color light emitting device, as shown in FIG. 2A showing a sequence from loading of substrates to unloading of the substrates, a hole transporting layer (referred to as HTL), a light emitting layer, and an electron transporting layer (referred to as ETL) are continuously laminated in the same film forming chamber, thereby improving the throughput. When the hole transporting layer, the light emitting layer, and the electron transporting layer are continuously laminated in the same film forming chamber, as shown in FIGS. 9A and 9B, plural evaporation source holders (evaporation source holders each moving in the direction X or in the direction Y) may be provided in one film forming chamber. By using an evaporation apparatus in FIGS. 9A and 9B, a utilization efficiency of an evaporation material can be improved.

The respective structures described above are characterized in that in at least two of the plural film forming chambers, evaporation processes of layers containing the same organic compound are performed in parallel.

Further, as shown in FIG. 6A showing an example of a sequence from loading of substrates to unloading of the substrates, a transfer path for a substrate is divided into the same number of paths as that of the film forming chambers arranged in connection to each transfer chamber, so that film formation can be efficiently performed in order. Note that an example of the path for one substrate from loading of substrates to unloading of the substrates is shown by the arrows in FIG. 3. Therefore, according to a fourth structure of the present invention disclosed in this specification, there is provided a manufacturing apparatus, including:

a load chamber;

a transfer chamber that is connected to the load chamber; and plural film forming chambers that are connected to the transfer chamber, wherein:

the plural film forming chambers are each connected to a vacuum-exhaust process chamber for setting an inside of the film forming chamber to vacuum, and each include: alignment means for performing position alignment of a mask and a substrate; an evaporation source; and means for heating the evaporation source; and plural substrates loaded into the load chamber are each assigned to one of the plural film forming chambers in the transfer chamber to be loaded thereinto, and each substrate undergoes processes along one of different paths whose number is the same as that of the film forming chambers.

Further, in the case of forming a full-color light emitting device, as shown in FIG. 2B, a hole transporting layer, a light emitting layer, and an electron transporting layer may preferably be continuously laminated in the same film forming chamber. When the hole transporting layer, the light emitting layer, and the electron transporting layer are continuously laminated in the same film forming chamber, there may be used such a film forming apparatus as shown in FIGS. 9A and 9B, that is, an evaporation apparatus provided with plural, at least three or more, evaporation source holders (evaporation source holders each moving in the direction X or in the direction Y) in one film forming chamber. Note that as shown in FIG. 4 showing a sequence from loading of substrates to unloading of the substrates, all the necessary organic layers, for example, the hole transporting layer, the light emitting layer, and the electron transporting layer may continuously be laminated in different three film forming chambers (a film forming chamber for a red light emitting element, a film forming chamber for a blue light emitting element, and a film forming chamber for a green light emitting element). For example, the hole transporting layer, the light emitting layer, and the electron transporting layer which are to compose a red light emitting element are selectively laminated by using an evaporation mask (R) in a first chamber; the hole transporting layer, the light emitting layer, and the electron transporting layer which are to compose a blue light emitting element are selectively laminated by using an evaporation mask (B) in a second chamber; and the hole transporting layer, the light emitting layer, and the electron transporting layer which are to compose a green light emitting element are selectively laminated by using an evaporation mask (G) in a third chamber, thereby realizing full-color display. Note that in FIG. 4, mask alignment is performed before evaporation in each chamber to perform film formation in a predetermined region.

Further, in the case where the hole transporting layer, the light emitting layer, and the electron transporting layer are laminated in one chamber, in order to realize the full-color display, for example, materials (organic materials to become the hole transporting layer and the electron transporting layer) optimum for a given color (R, G, or B) can be selected appropriately. The feature of the present invention also resides in that the film thicknesses of those layers can be changed in accordance with colors. Therefore, different materials can be used for all the nine types of layers in total: the hole transporting layer, the light emitting layer, and the electron transporting layer for R; the hole transporting layer, the light emitting layer, and the electron transporting layer for G; and the hole transporting layer, the light emitting layer, and the electron transporting layer for B. Note that organic materials to become the hole transporting layer or the electron transporting layer may be used as the common materials.

Further, in the case where the hole transporting layers, the light emitting layers, and the electron transporting layers for R, G, and B are laminated in the different three film forming chambers, an example of the path for one substrate is shown simply by the arrows in FIG. 5. For example, after a first substrate is loaded into a first film forming chamber, a layer containing an organic compound for red light emission is formed into a laminate film, and then the first substrate is unloaded. Subsequently, after the first substrate is loaded into a second film forming chamber, a layer containing an organic compound for green light emission is formed into a laminate film, while after a second substrate is loaded into the first film forming chamber, a layer containing an organic compound for red light emission may be laminated to the second substrate to form a film. Lastly, after the first substrate is loaded into a third film forming chamber, a layer containing an organic compound for blue light emission is formed into a laminate film, while after the second substrate is loaded into the second film forming chamber, a third substrate is loaded into the first film forming chamber, and layers may be sequentially be laminated to the respective substrates.

Further, the present invention is not limited to the structure in which the hole transporting layer, the light emitting layer, and the electron transporting layer are continuously laminated in the same chamber. However, the hole transporting layer, the light emitting layer, and the electron transporting layer may be laminated in plural chambers connected to each other. For example, the hole transporting layer to compose a green light emitting element is formed into a film in the first chamber, the light emitting layer to compose the green light emitting element is formed into a film in the second chamber, and the electron transporting layer to compose the green light emitting element is formed into a film in the third chamber. Accordingly, the layers containing an organic compound for green light emission may be formed into laminate films.

Further, in the above description, as the typical example of layers containing an organic compound arranged in a position between a cathode and an anode, the laminate structure of the three layers consisting of the hole transporting layer, the light emitting layer, and the electron transporting layer. However, there is no particular limitation thereon. Another laminate structure may be used in which: a hole injecting layer, a hole transporting layer, a light emitting layer, and an electron transporting layer are laminated onto an anode in the stated order; or a hole injecting layer, a hole transporting layer, a light emitting layer, an electron transporting layer, and an electron injecting layer are laminated onto an anode in the stated order. Alternatively, a double layer structure or a single layer structure may be used. Fluorescent pigments and the like may also be doped into the light emitting layers. Also, examples of the light emitting layers include a light emitting layer having hole transportability and a light emitting layer having electron transportability. Further, all of the above layers may be formed using only low-molecular weight materials, or one or several layers of the above layers may be formed using high-molecular weight materials. Note that in this specification, the layers provided between the cathode and the anode are generically referred to as a layer (EL layer) containing an organic compound. Therefore, the hole injecting layer, the hole transporting layer, the light emitting layer, the electron transporting layer, and the electron injecting layer which are described above are all included in the EL layers. In addition, the layer (EL layer) containing an organic compound may also contain an inorganic material such as silicon.

Note that a light emitting element (EL element) has a layer (hereinafter referred to as EL layer) containing an organic compound in which luminescence developed by applying an electric field (electroluminescence) is obtained, an anode, and a cathode. The types of the organic compound luminescence includes light emission when returning from a singlet excitation state to a ground state (fluorescence) and light emission when returning from a triplet excitation state to a ground state (phosphorescence). Both types of light emission can be applied to a light emitting device produced according to the present invention.

Further, in the light emitting device according to the present invention, there is no particular limitation on a drive method for screen display. For example, a dot-sequential drive method, a line-sequential drive method, a plane-sequential drive method, and the like are used. Typically, the line-sequential drive method is used, and a time-division gray scale drive method and an area gray scale drive method may also be used appropriately. Also, a picture signal inputted to a source line of the light emitting device may be an analog signal or may be a digital signal, so that drive circuits and the like may be designed appropriately in accordance with picture signals.

BRIEF DESCRIPTION OF THE DRAWINGS

In the accompanying drawings:

FIGS. 18A and 18B show the light emitting device according to Example 1 of the present invention;

FIGS. 19A to 19C show the light emitting device according to Example 1 of the present invention;

DETAILED DESCRIPTION OF THE PREFERRED EXAMPLES

Hereinafter, embodiments of the present invention will be described.

Embodiment 1

Figure 1:
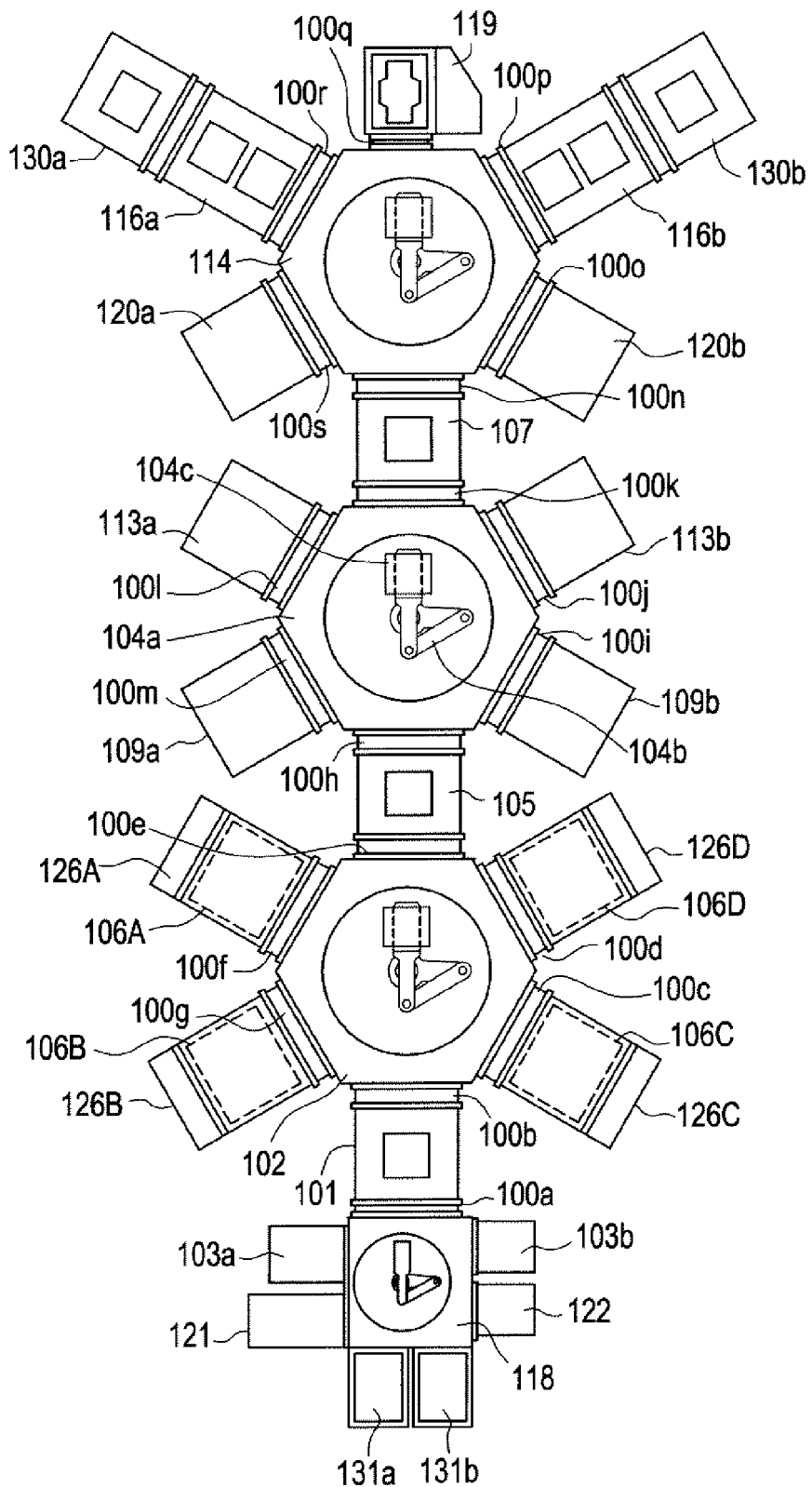
FIG. 1 shows an example of a manufacturing apparatus according to Embodiment 1 of the present invention.
Figure 2A:
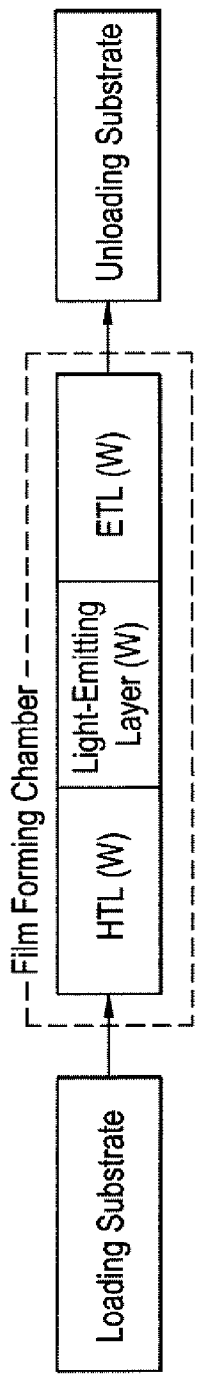
FIGS. 2A and 2B each show an example of a sequence for the manufacturing apparatus according to Embodiment 1.
Figure 2B:
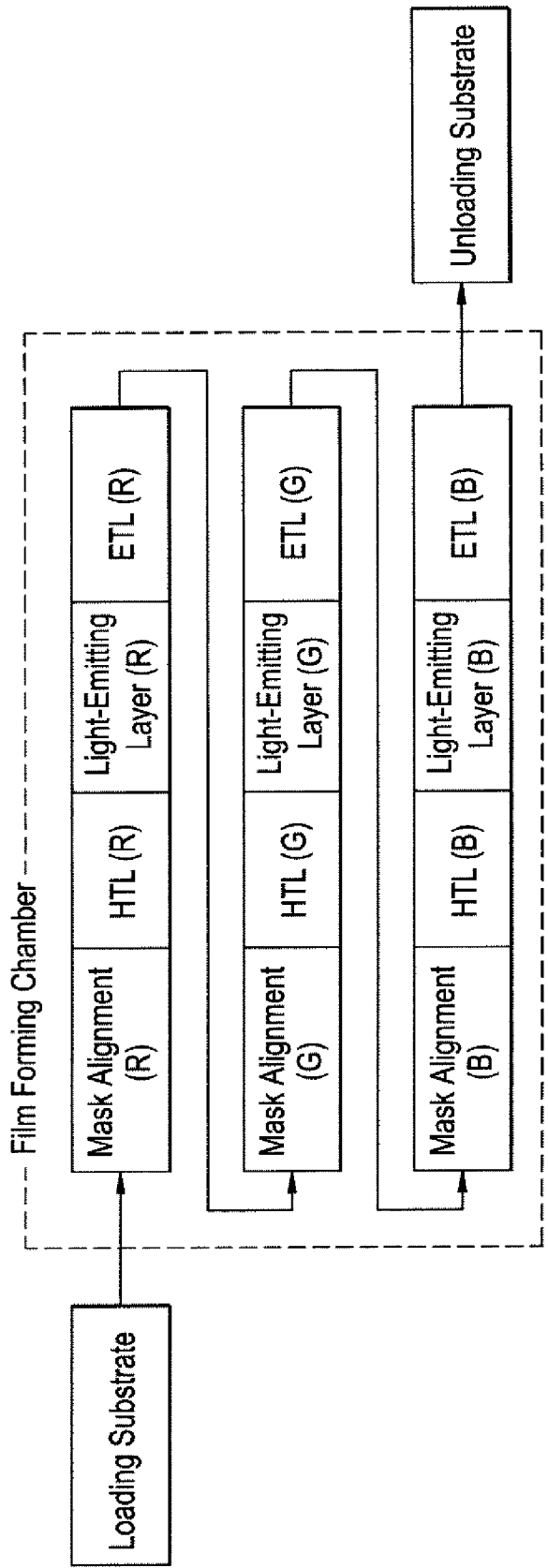
Figure 3:
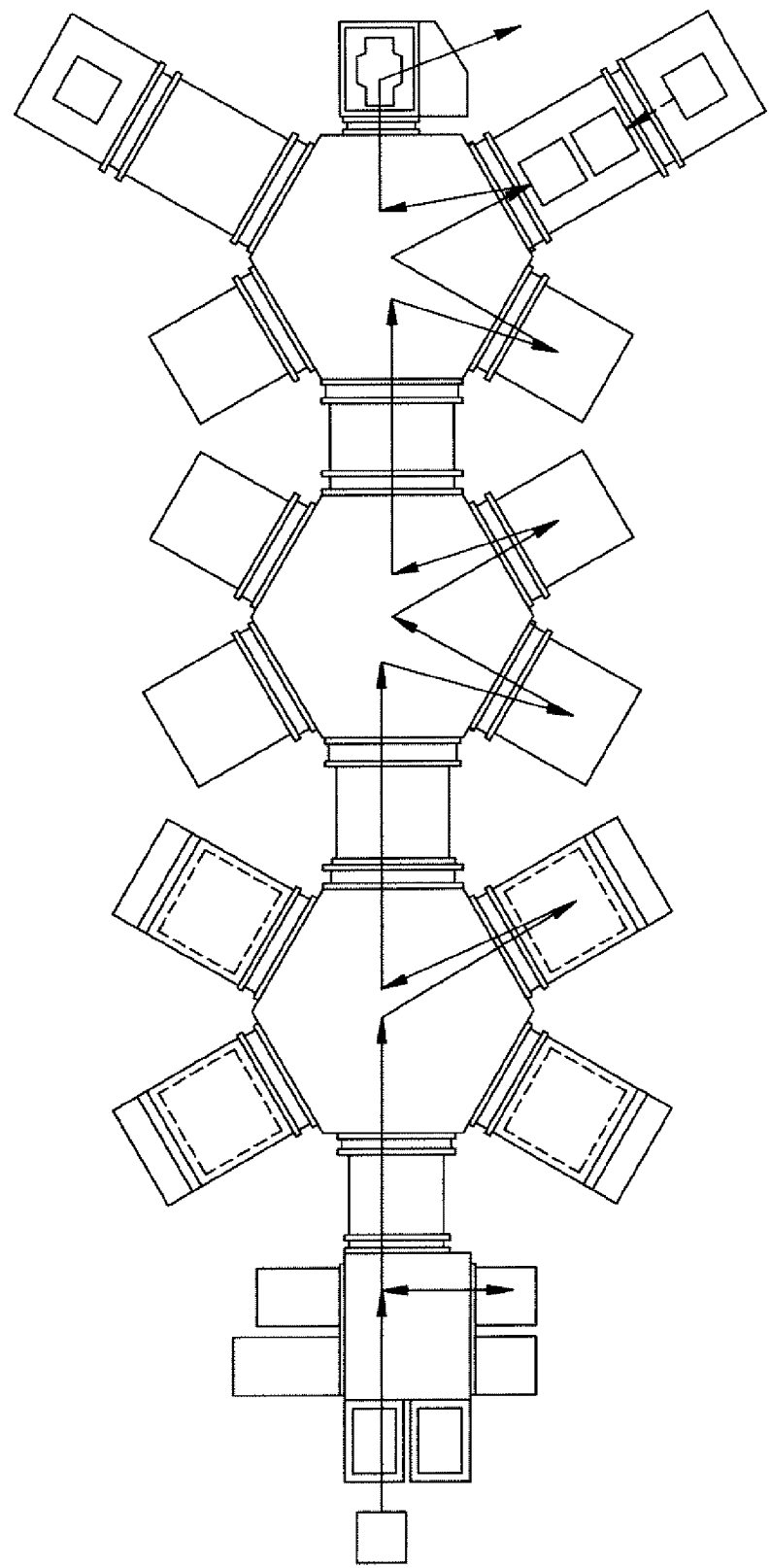
FIG. 3 shows an example of a transfer path for a substrate according to Embodiment 1.
Figure 4:
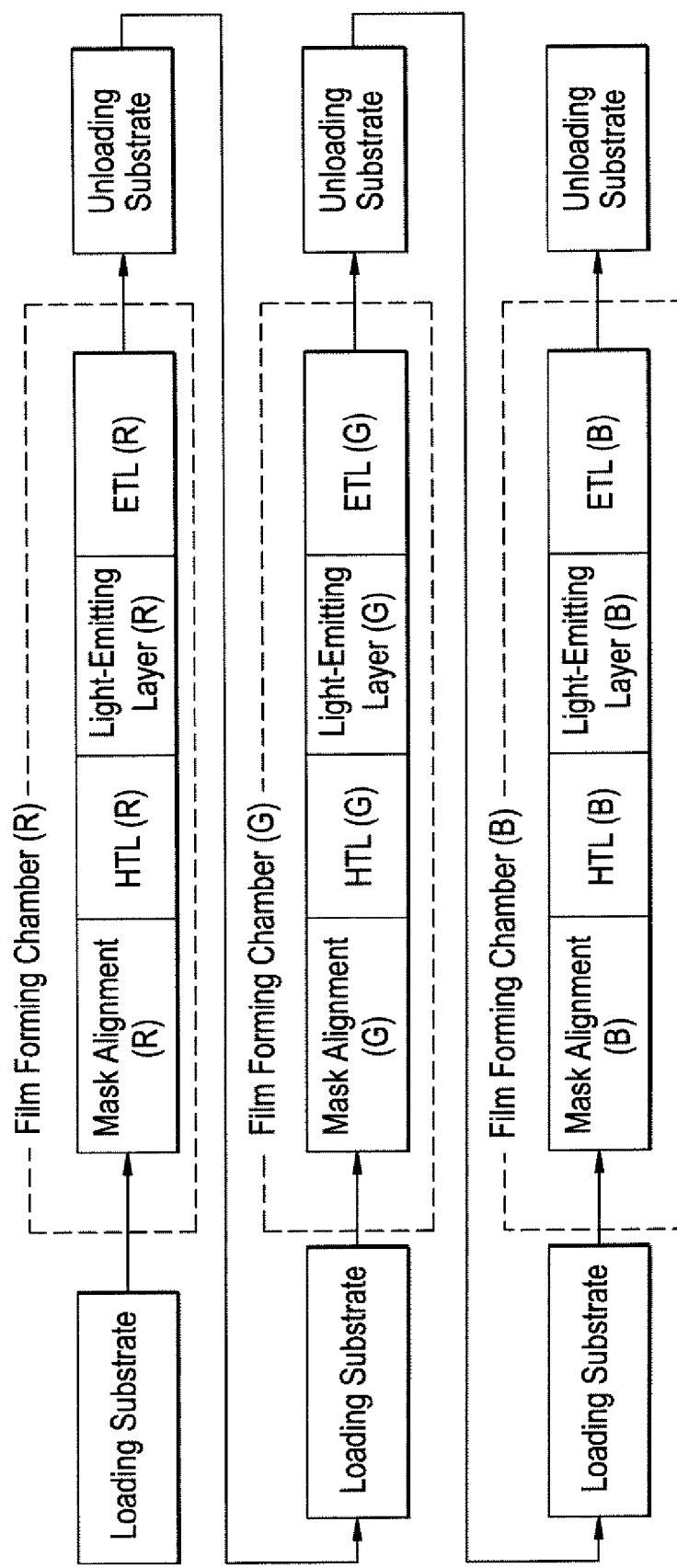
FIG. 4 shows another example of the sequence for the manufacturing apparatus according to Embodiment 1.
Figure 5:
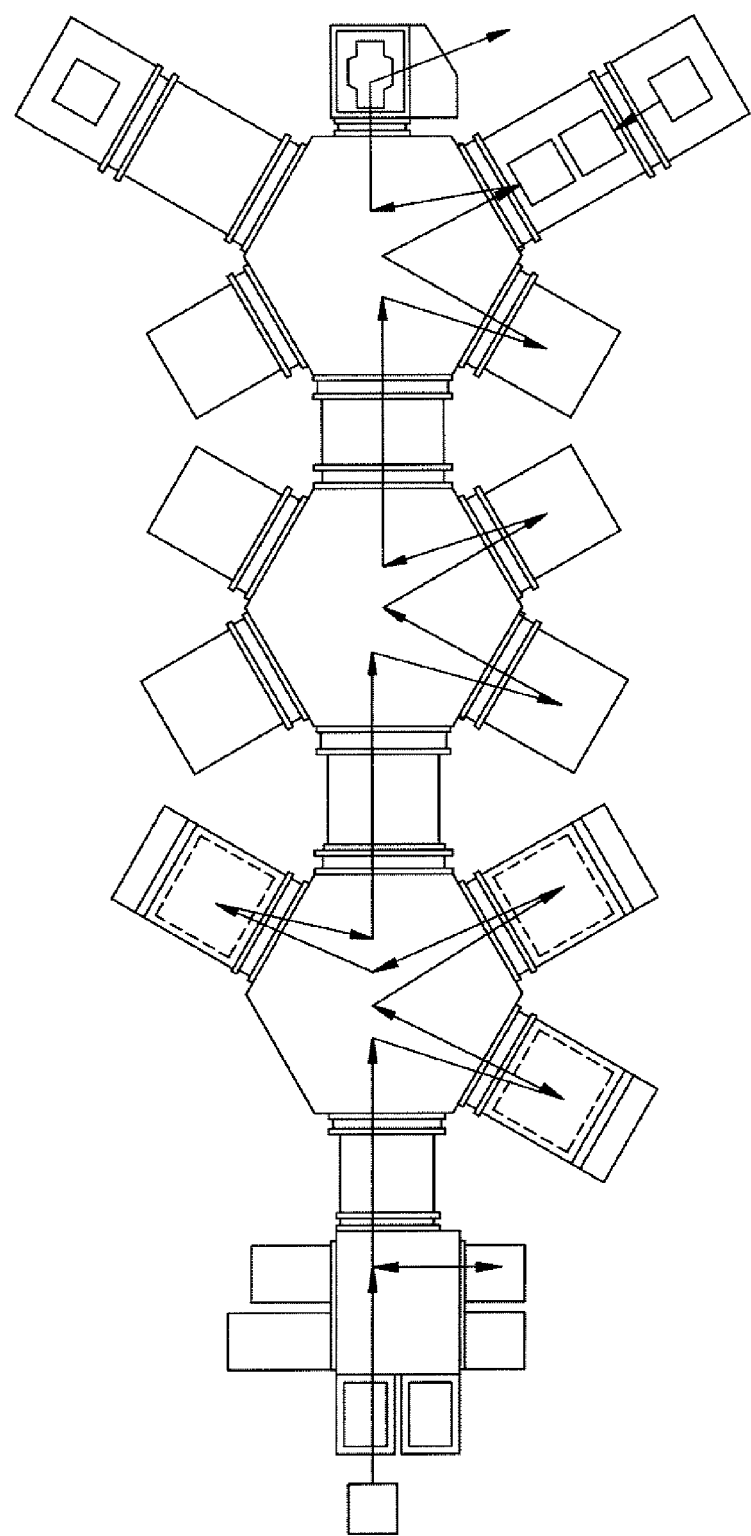
FIG. 5 shows an example of the transfer path for a substrate according to Embodiment 1.
Figure 6A:
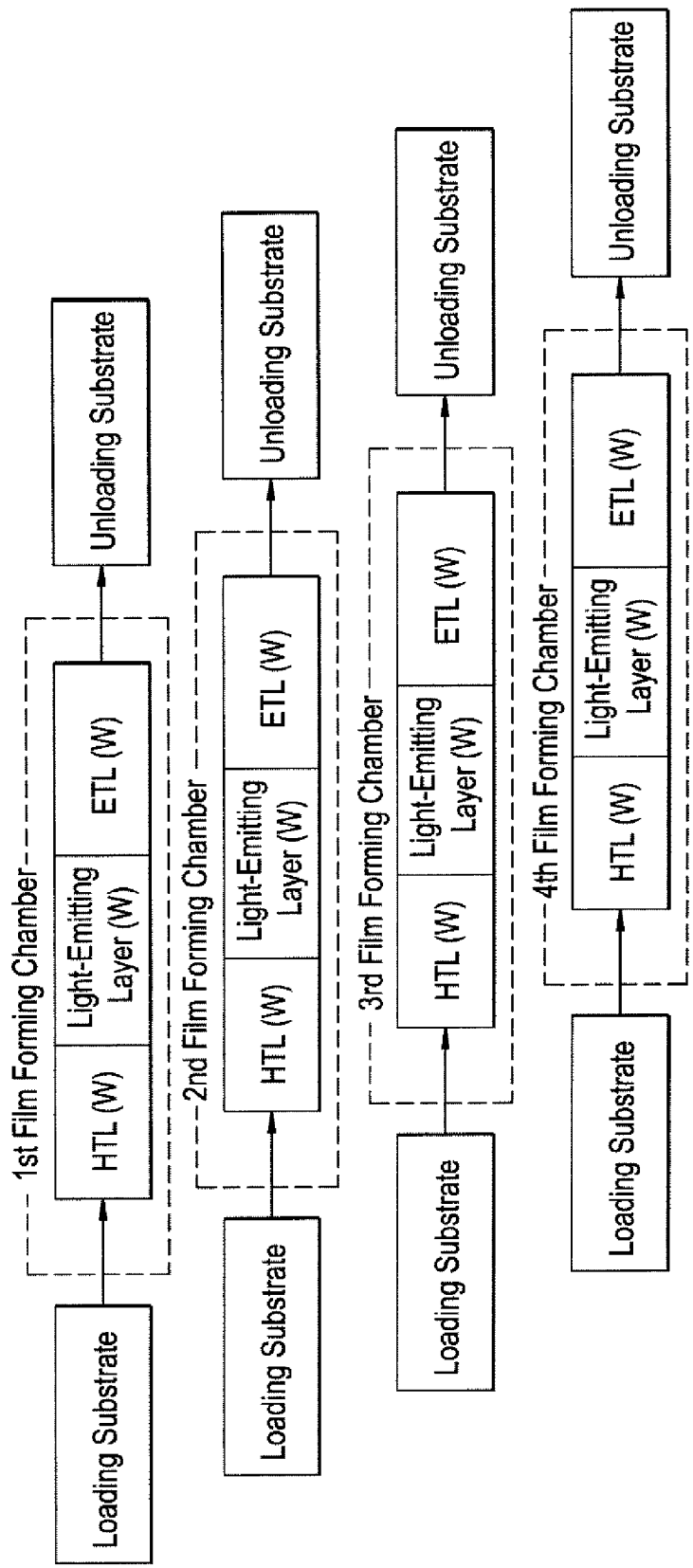
FIGS. 6A and 6B each show another example of the sequence for the manufacturing apparatus according to Embodiment 1.
Figure 6B:
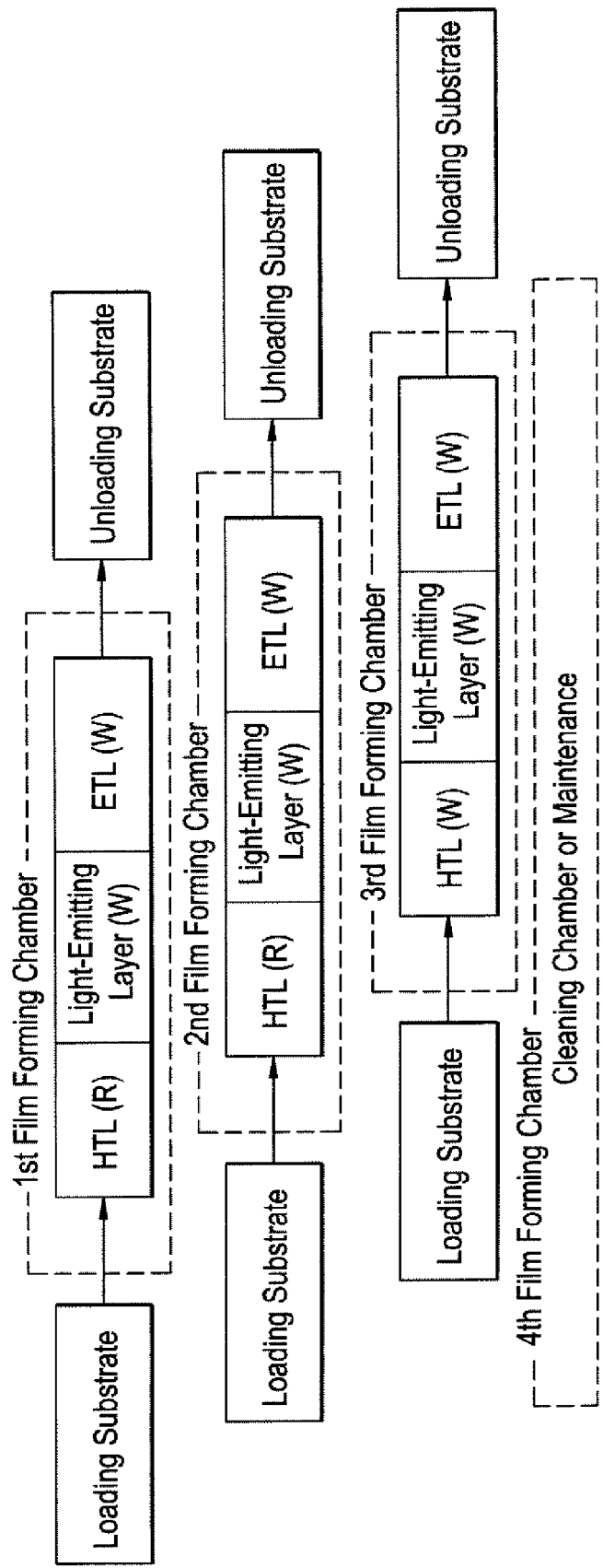

FIG. 1 shows an example of a manufacturing apparatus of a multi-chamber system in which all production processes are automated from a process of forming a first electrode to a sealing process.

The multi-chamber manufacturing apparatus shown in FIG. 1 includes: gates 100*a* to 100*s*; a take-out chamber 119; transfer chambers 104*a*, 102, 114, and 118; handing-over chambers 105 and 107; a preparation chamber 101; a first film forming chamber 106A; a second film forming chamber 106B; a third film forming chamber 106C; a fourth film forming chamber 106D; other film forming chambers 109*a*, 109*b*, 113*a*, and 113*b*; process chambers 120*a* and 120*b*; setting chambers 126A, 126B, 126C, and 126D for installing an evaporation source; pre-treatment chambers 103*a* and 103*b*; a first sealing chamber 116*a*; a second sealing chamber 116*b*; a first stock chamber 130*a*; a second stock chamber 130*b*; cassette chambers 131*a* and 131*b*; a tray putting stage 121; and a washing chamber 122.

Hereinafter, a description will be made of a procedure for producing a light emitting device after a substrate to which a thin-film transistor, an anode (first electrode), and an insulator covering an end portion of the anode are formed in advance is loaded into the manufacturing apparatus shown in FIG. 1.

First, the above-mentioned substrate is set in the cassette chamber 131*a* or 131*b*. If the substrate has a large size (for example, 300 mm×360 mm), the substrate is set in the cassette chamber 131*a* and 131*b*. If the substrate has a normal size (for example, 127 mm×127 mm), the substrate is transferred to the tray putting stage 121 and plural substrates are set in a tray (having a size of, for example, 300 mm×360 mm).

Next, the plural substrates each formed with the thin-film transistor, the anode, and the insulator covering an end portion of the anode are transferred to the transfer chamber 118, and then further transferred to the washing chamber 122 to remove impurities (such as fine particles) from the substrate surfaces by using a solution. If the substrates are washed in the washing chamber 122, the substrates are set with the surfaces to be formed with a film facing downward at the atmospheric pressure.

Also, before forming a film containing an organic compound, in order to remove moisture and gas from within the substrates, it is preferable to perform annealing for degasification in vacuum. Therefore, the substrates may be transferred to the pretreatment chambers 103*a* and 103*b* each connected to the transfer chamber 118, to be subjected to annealing therein. Also, if a film containing an organic compound formed to an unnecessary portion is to be removed, the substrates are transferred to the pretreatment chambers 103*a* and 103*b* to selectively remove a laminate of organic compound film layers. The pretreatment chambers 103*a* and 103*b* each have plasma generating means, and generate plasma by exciting one or plural kinds of gas selected from the group consisting of Ar, H, F, and O, to thereby perform dry etching. Here, it is shown as an example that the two pretreatment chambers 103a and 103b are provided to allow treatment on the two substrates substantially in parallel with each other.

Next, the substrates are transferred from the transfer chamber 118 provided with a substrate transferring mechanism to the preparation chamber 101. In the manufacturing apparatus of this embodiment, the preparation chamber 101 has a substrate inverting mechanism and can invert the substrates appropriately. The preparation chamber 101 is connected to a vacuum-exhaust process chamber and preferably set to the atmospheric pressure by introducing inert gas into the chamber after the chamber is vacuum-exhausted.

Next, the substrates are transferred to the transfer chamber 102 connected to the preparation chamber 101. It is preferable that the transfer chamber 102 be vacuum-exhausted in advance and maintain vacuum so as to contain as little moisture and oxygen as possible.

The above-mentioned vacuum-exhaust process chamber is provided with a magnetic levitation turbomolecular pump, a cryopump, or a dry pump. The pump makes it possible for the transfer chamber connected to the preparation chamber to reach a vacuum level of $10^{-5}$ to $10^{-6}$ Pa. In addition, reverse diffusion of impurities from the pump side and the exhaust system can be controlled. In order not to let impurities enter the interior of the device, inert gas such as nitrogen or rare gas is introduced. Used as the gas introduced into the device is one that is refined to have a high purity by a gas refining machine prior to introduction to the device interior. Thus, it is necessary to provide a gas refining machine such that the gas is refined to have a high purity and, after that, introduced into an evaporation apparatus. Accordingly, oxygen, water, and other impurities are removed from within the gas in advance, thereby making it possible to prevent those impurities from entering the device interior.

Next, the substrates are transferred from the transfer chamber 102 to the first forming chamber 106A, the second film forming chamber 106B, the third film forming chamber 106C, and the fourth film forming chamber 106D. Then, low-molecular weight organic compound layers are formed which serve as hole injecting layers, hole transporting layers, and light emitting layers.

As overall light emitting elements, organic compound layers exhibiting single-color (specifically white) light emission or full-color (specifically red, green, and blue) light emission can be formed. Here, an example will be described in which the organic compound layers exhibiting white light emission are formed in the respective film forming chambers 106A, 106B, 106C, and 106D at the same time (each film forming process is performed approximately in parallel).

Note that in the case where the organic compound layers exhibiting white light emission are a laminate of light emitting layers having different light emission colors, the organic compound layers are broadly divided into two types: a three wavelength type that includes the primary colors of red, green, and blue and a two wavelength type that utilizes the relationship between complementary colors of blue and yellow or blue-green and orange. Here, an example will be described in which a white light emitting element is obtained using the three wavelength type.

First, the respective film forming chambers 106A, 106B, 106C, and 106D will be described. The film forming chambers 106A, 106B, 106C, and 106D each have movable evaporation source holders, which are prepared in plural numbers. In each of the film forming chambers, five evaporation source holders are set in the following states: a first evaporation source holder has aromatic diamine (referred to as TPD) for forming a white light emitting layer sealed therein; a second evaporation source holder has p-EtTAZ for forming a white light emitting layer sealed therein; a third evaporation source holder has $Alq_3$ for forming a white light emitting layer sealed therein; a fourth evaporation source holder has an EL material sealed therein which is obtained by doping $Alq_3$ for forming a white light emitting layer with Nile Red that is a red light emitting pigment; and a fifth evaporation source holder has $Alq_3$ sealed therein.

It is preferable that EL materials be set in the above film forming chambers by using the following manufacturing system. That is, it is preferable that a container (typically a melting pot) in which an EL material is stored in advance by a material manufacturer be used to form a film. In addition, it is preferable that the container be set without being exposed to the atmosphere. Thus, it is preferable that the melting pot be sealed in a second container when being shipped from the material manufacturer, and then be loaded into a film forming chamber while maintaining the sealed state. It is desirable that the setting chambers 126A, 126B, 126C, and 126D each having vacuum-exhaust means and connected to the film forming chambers 106A, 106B, 106C, and 106D, respectively, be set to vacuum or an inert gas atmosphere, and melting pots be taken out of second containers in the setting chambers and then be set in the film forming chambers. As a result, a melting pot and an EL material stored in the melting pot can be protected from contamination. Note that metal masks may be stocked in the setting chambers 126A, 126B, 126C, and 126D.

Next, film forming steps will be described. In the film forming chamber 106A, a mask is transferred from the setting chamber described above and set as the need arises. Then, the first to fifth evaporation source holders start to move sequentially to perform evaporation to the substrate. More specifically, TPD from the first evaporation source holder is sublimated by heating and is deposited by evaporation on the entire surface of the substrate. After that, p-EtTAZ from the second evaporation source holder is sublimated, $Alq_3$ from the third evaporation source holder is sublimated, $Alq_3$: Nile Red from the fourth evaporation source holder is sublimated, and $Alq_3$ from the fifth evaporation source holder is sublimated, which are all deposited by evaporation on the entire surface of the substrate.

In the case of using an evaporation method, it is preferable to perform evaporation in the film forming chamber that is vacuum-exhausted to reach a vacuum level of $5 \times 10^{-3}$ Torr (0.665 Pa) or lower, preferably, $10^{-4}$ to $10^{-6}$ Pa.

Figure 7:
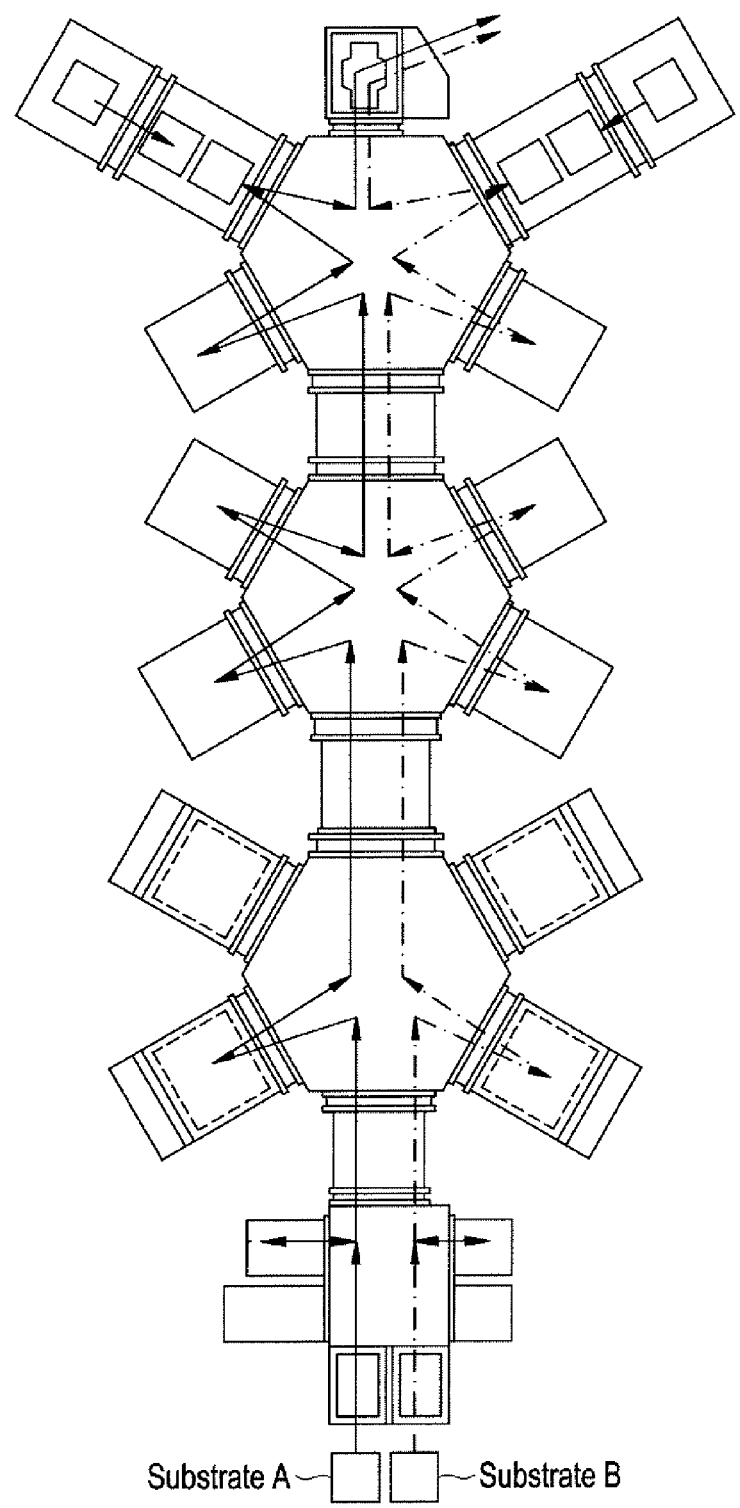
FIG. 7 shows an example of a transfer path for two substrates according to Embodiment 1.

Note that the above-mentioned evaporation source holders with the EL materials set therein are provided in the respective film forming chambers, and also in the respective film forming chambers 106B to 106D, evaporation is performed in the same manner. In other words, the same film forming process can be performed to four substrates approximately in parallel. FIG. 7 shows a simple example of the path along which two of the four substrates are processed. As a result, even if a given film forming chamber is undergoing maintenance or cleaning, the film forming process is possible in the rest of the film forming chambers, thereby reducing the cycle time for the film formation. Accordingly, the throughput of the light emitting device can be improved.

Next, the substrate is transferred from the transfer chamber 102 to the handing-over chamber 105, and further transferred from the handing-over chamber 105 to the transfer chamber 104a without being exposed to the atmosphere.

Next, a transfer mechanism set in the transfer chamber 104a is used to transfer the substrate to the film forming chamber 109a or the film forming chamber 109b, and then a cathode is formed to the substrate. The cathode may be formed by laminating two cathodes (lower layer and upper layer). The cathode (lower layer) is formed of an extremely thin metal film (MgAg, MgIn, AlLi, CaN, or like other alloy film, or a film formed by co-evaporation of aluminum and an element that belongs to Group 1 or 2 in the periodic table) formed by evaporation using resistance heating. The cathode (upper layer) is formed of a transparent conductive film (an indium tin oxide alloy (ITO) film, an indium oxide-zinc oxide alloy ($In_2O_3$—ZnO) film a zinc oxide (ZnO) film, or the like) formed by sputtering. Therefore, it is preferable that a film forming chamber for forming a thin metal film be arranged in the manufacturing apparatus.

Figure 17A:
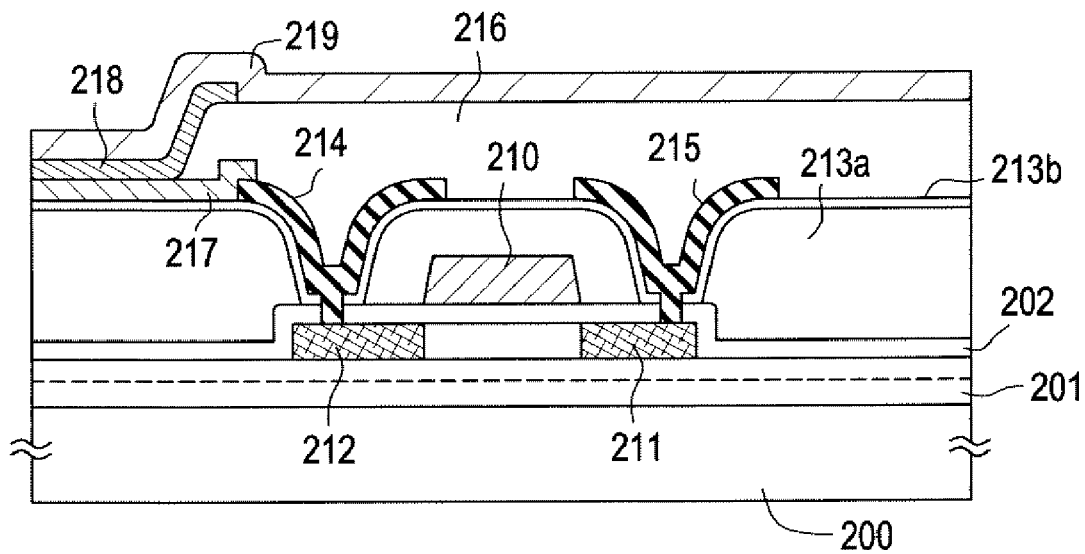
FIGS. 17A and 17B show a light emitting device according to Example 1 of the present invention.
Figure 17B:
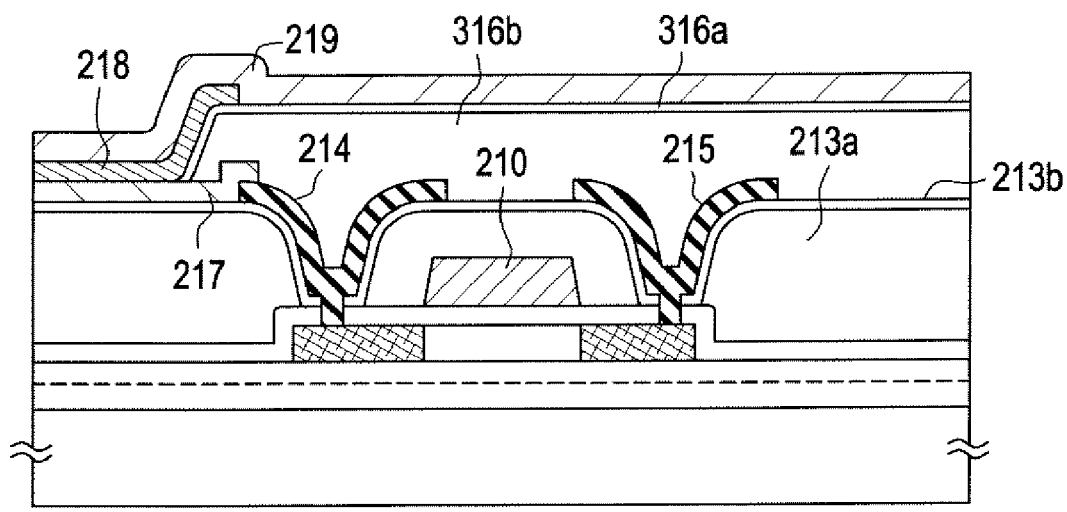

Through the above steps, a light emitting element having a laminate structure as shown in FIGS. 17A and 17B is formed.

Next, without being exposed to the atmosphere, the substrate is transferred from the transfer chamber 104a to the film forming chamber 113a or 113b, and then a protective film consisting of a silicon nitride film or a silicon nitroxide film is formed to the substrate. Here, the film forming chambers 113a and 113b each include a silicon target, a silicon oxide target, or a silicon nitride target. For example, a silicon nitride film can be formed by using the silicon target and setting the atmosphere in the film forming chamber to a nitrogen atmosphere or an atmosphere containing nitrogen and argon. FIG. 1 shows an example system provided with the two film forming chambers 113a and 113b such that a protective film can be formed to two substrates approximately in parallel.

Next, without being exposed to the atmosphere, the substrate formed with a light emitting device is transferred from the transfer chamber 104a to the handing-over chamber 107, and further transferred from the handing-over chamber 107 to the transfer chamber 114. Then, the substrate formed with a light emitting device is transferred from the transfer chamber 114 to the first sealing chamber 116a or the second sealing chamber 116b. Note that in the first sealing chamber 116a and the second sealing chamber 116b, a sealing member for bonding substrates to each other later or for sealing a substrate is formed. FIG. 1 shows an example system provided with the two sealing chambers 116a and 116b such that a bonding process can be performed to two substrates approximately in parallel.

A sealing substrate is set in the first stock chamber 130a or the second stock chamber 130b from the outside for preparation. Note that in order to remove moisture and other impurities, it is preferable that the sealing substrate be subjected to annealing in vacuum in advance, for example, within the first stock chamber 130a or the second stock chamber 130b. If the sealing member for bonding the sealing substrate and the substrate on which the light emitting element is formed is formed on the sealing substrate, the sealing member is formed in the first stock chamber 130a or the second stock chamber 130b, and the sealing substrate on which the sealing member is formed is then transferred to the first sealing chamber 116a or the second sealing chamber 116b. Note that the sealing substrate may be provided with a desiccant in the first sealing chamber 116a or the second sealing chamber 116b. Also, the first sealing chamber 130a and the second sealing chamber 130b may be stocked with an evaporation mask to be used at the time of evaporation.

Next, in order to perform degasification to the substrate provided with the light emitting device, after performing annealing in vacuum or in an inert gas atmosphere, the sealing substrate provided with the sealing member and the substrate formed with the light emitting device are bonded to each other. Also, an enclosed space is filled with nitrogen or inert gas. Note that here, the example of forming the sealing member on the sealing substrate is shown. However, there is no particular limitation and the sealing member may be formed on the substrate formed with the light emitting element.

Next, the pair of bonded substrates are irradiated with UV light by a UV ray irradiation mechanism provided in the sealing chamber 116a, 116b to thereby cure the sealing member. Note that a UV-curable and thermoset resin is used here as the sealing member. However, there is no particular limitation as long as an adhesive is used as the sealing member, and such a resin as one curable by only a UV ray may be used.

Further, instead of filling the enclosed space with inert gas, a resin may be filled therein. In the case of a downward emission type, no light transmits through the cathode, so that the material for the resin to be filled are not particularly limited and the UV-curable resin or an opaque resin may be used. However, in the case of an upward emission type, a UV ray transmits through the cathode to cause damage to the EL layer, so that the UV-curable resin cannot be used. Thus, in the case of an upward emission type, it is preferable to use a transparent thermoset resin as the resin to be filled.

Next, the pair of bonded substrates are transferred from the sealing chamber 116a, 116b to the transfer chamber 114, and then transferred from the transfer chamber 114 to the take-out chamber 119 to be taken out thereof.

Further, after being taken out of the take-out chamber 119, the sealing member is cured by heat treatment. In the case of using the upward emission type and filling the enclosed space with the thermoset resin, the thermoset resin can be cured simultaneously with the heat treatment for curing the sealing member.

As described above, the use of the manufacturing apparatus shown in FIG. 1 prevents a light emitting element from being exposed to the atmosphere before the light emitting element is completely sealed in an enclosed space. As a result, a light emitting device having high reliability can be produced. Note that the transfer chamber 114 alternates between vacuum and a nitrogen atmosphere at the atmospheric pressure. However, it is desirable that the transfer chambers 102, 104a, and 108 maintain vacuum all the time.

Note that, although not shown in the figures, a control drive unit is provided which controls the path along which substrates are moved to individual process chambers, to thereby realize a fully automatic system.

Also, it is possible to load a substrate formed with a transparent conductive film as the anode into the manufacturing apparatus shown in FIG. 1, and form a light emitting element (having a structure in which light emission caused in a layer containing an organic compound is taken out from the transparent anode toward a TFT; hereinafter referred to as downward emission structure) that emits light in the direction opposite to that of the laminate structure described above.

In the case where both the anode and the cathode are composed of a transparent or translucent material, it is also possible to form a structure in which light emission caused in the layer containing the organic compound is taken out toward both the upper surface and the lower surface (hereinafter referred to as double-sided emission structure).

Figure 21:
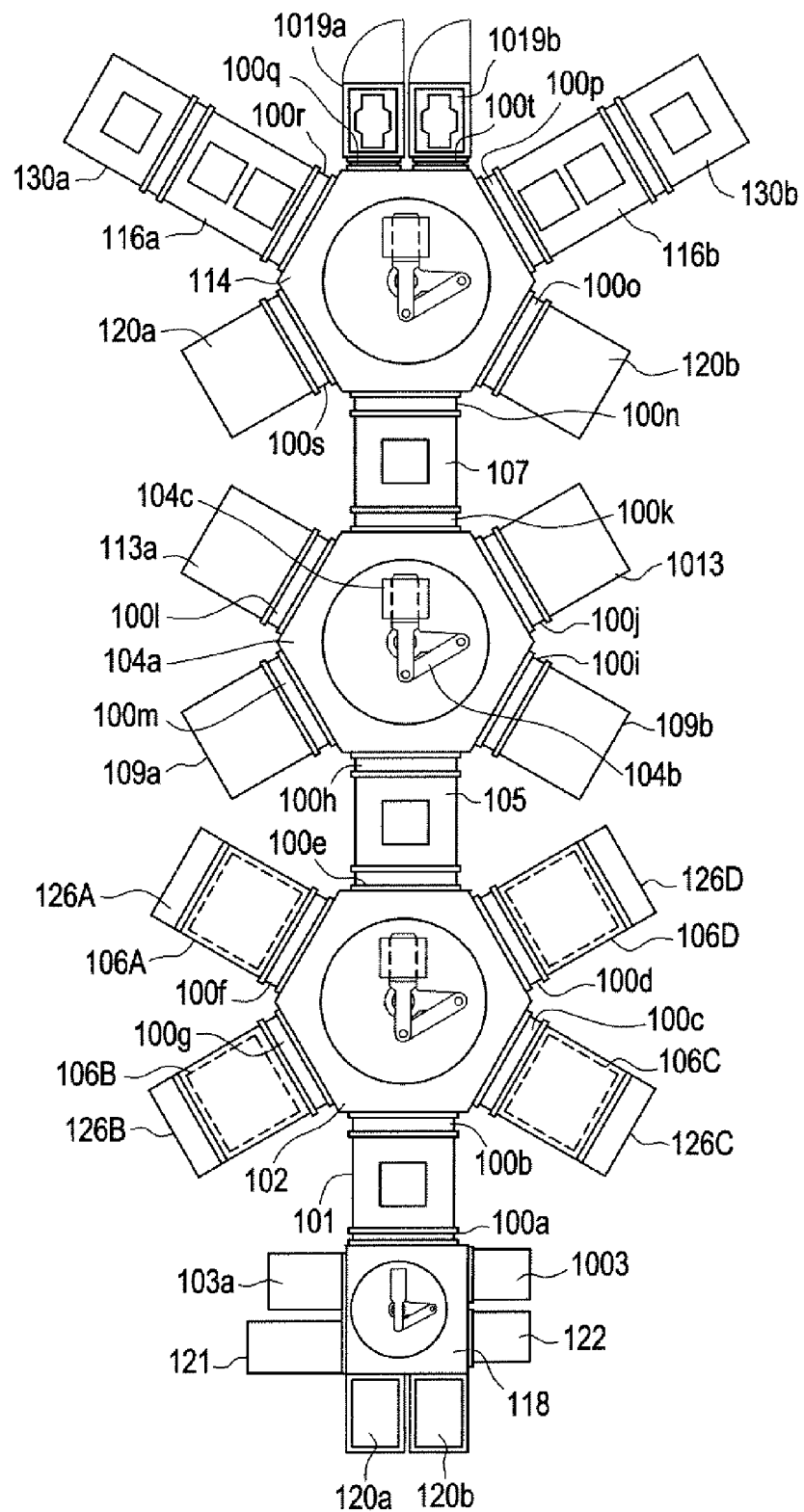
FIG. 21 shows another example of the manufacturing apparatus according to Embodiment 1 of the present invention.
Figure 22:
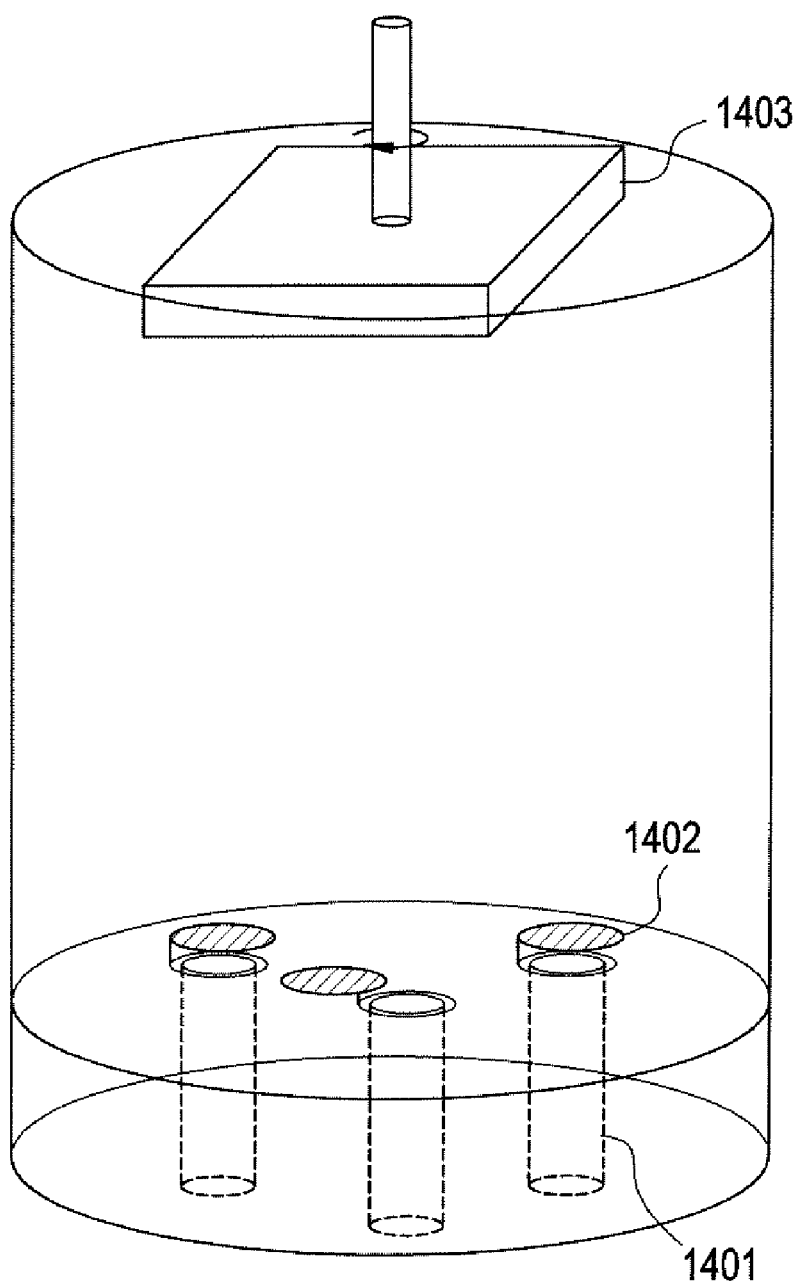
FIG. 22 shows a conventional evaporation apparatus.

Further, FIG. 21 shows an example of a manufacturing apparatus provided with two take-out chambers because plural take-out chambers become necessary in the case where elements are produced by simultaneously processing two substrates in different sizes in parallel. A mask stock chamber and a coating chamber are also provided in FIG. 21. Note that in FIG. 21, the same reference numerals as those in FIG. 1 are used.

In FIG. 21, reference numeral 100*t* denotes a gate, 1003 the coating chamber, 1013 the mask stock chamber, and reference numerals 1019*a* and 1019*b* denote the take-out chambers.

Note that the mask stock chamber 1013 is stocked with evaporation masks to be used at the time of evaporation. The evaporation masks are appropriately transferred to each film forming chamber when performing evaporation, and then set therein. In particular, it is difficult to stock the mask having a large area in the setting chamber, so that it is preferable to separately provide the mask stock chamber as shown in FIG. 21. Also, the mask stock chamber 1013 may be stocked with not only the evaporation masks but also, for example, substrates.

Further, in the coating chamber 1003, a layer containing a high-molecular weight material may be formed by an ink jet method or a spin coating method. For example, an aqueous solution of poly(ethylene dioxythiophene)/poly(styrene sulfonic acid) (PEDOT/PSS) acting as a hole injecting layer (an anode buffer layer), an aqueous solution of polyaniline/camphor sulfonic acid (PANI/CSA), PTPDES, Et-PTPDEK, PPBA or the like may be coated over the entire surface of the first electrode (anode) and then subjected to baking.

Further, the PEDOT/PSS film formed by the spin coating method covers the entire surface. Accordingly, it is preferable to selectively remove portions of the film that cover end surfaces and perimeter of the substrate, a terminal portion, a region where a cathode and a lower wiring are connected to each other, and the like. For example, it is preferable that the removal is performed by $O_2$ ashing or the like using a mask in the pretreatment chamber 103*a*.

Embodiment 2

Figure 8A:
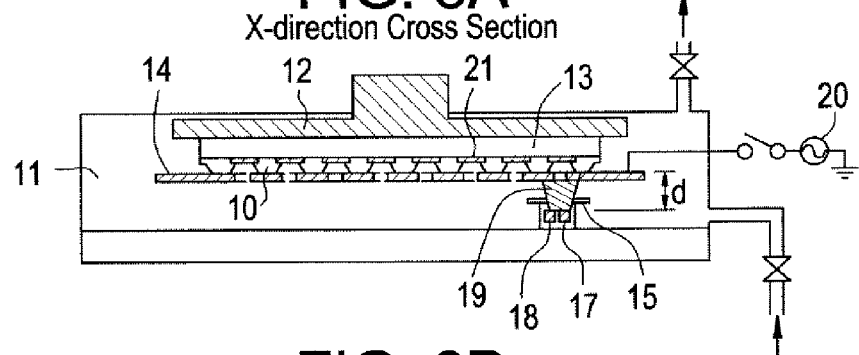
FIGS. 8A to 8C show an evaporation apparatus according to Embodiment 2 of the present invention.
Figure 8B:
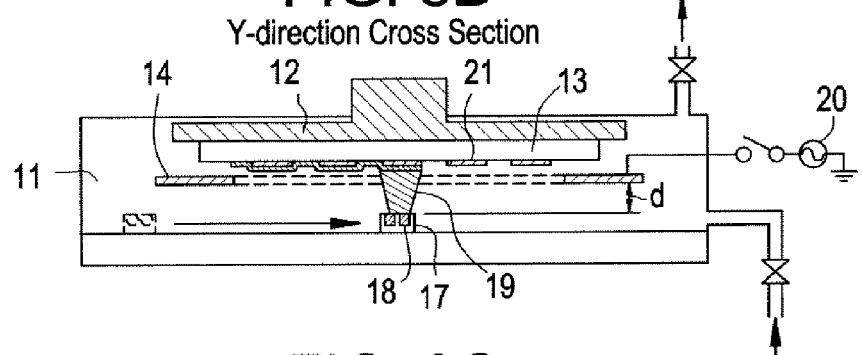
Figure 8C:
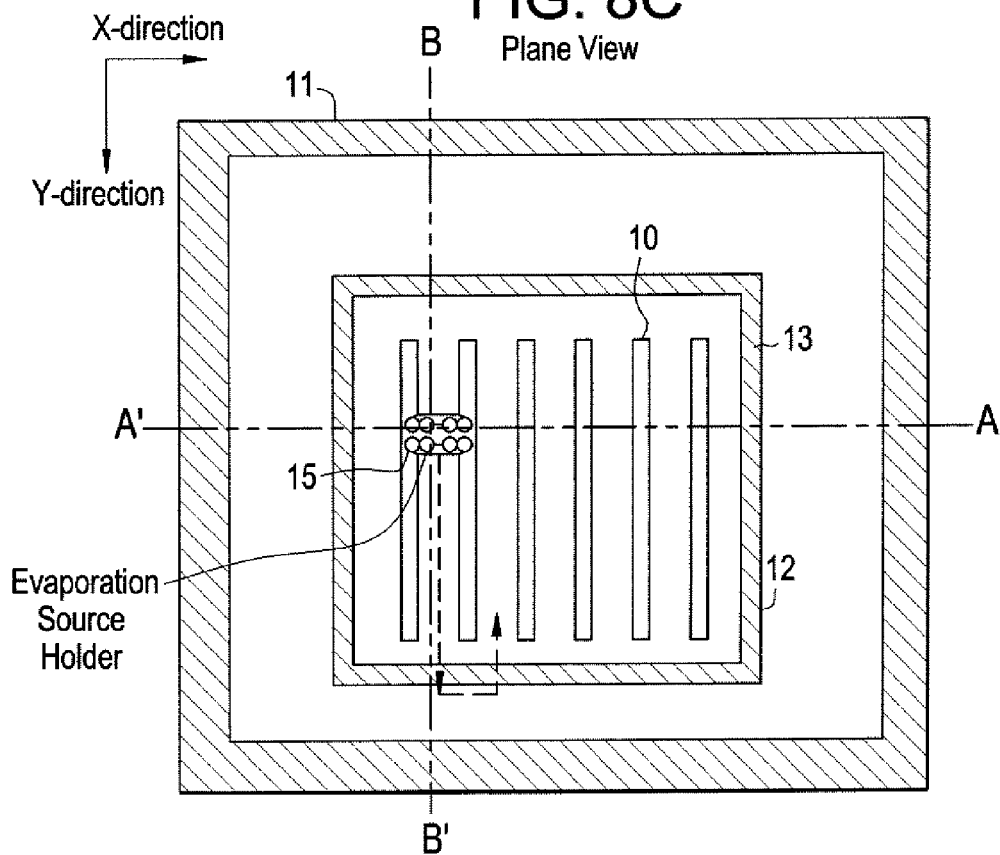

FIGS. 8A to 8C show a film forming system featured in moving a substrate and an evaporation source relative to each other. FIG. 8A is a sectional view in X direction (a section taken along a dotted line A-A'), FIG. 8B is a sectional view in Y direction (a section taken along a dotted line B-B') and FIG. 8C is a top view. Further, FIGS. 8A, 8B and 8C show the evaporation system in the midst of evaporation.

The film forming system shown in FIGS. 8A to 8C is characterized in that in an evaporation system, an evaporation source holder installed with a container filled with an evaporation material is moved by a certain pitch relative to a substrate or the substrate is moved by a certain pitch relative to the evaporation source. Further, it is preferable to move the evaporation source holder by a certain pitch to overlap ends (skirts) of a sublimated evaporation material.

Although a single or a plurality of the evaporation source holders may be constituted, when the evaporation source holders are provided for respective laminated films of EL layers, evaporation can be carried out efficiently and continuously. Further, a single or a plurality of containers may be installed at the evaporation source holder and a plurality of containers filled with the same evaporation material may be installed. Further, when containers having different evaporation materials are arranged, a film can be formed at a substrate in a state of mixing the sublimated evaporation materials (this is referred to as common evaporation).

In FIGS. 8A to 8C, a film forming chamber 11 includes a substrate holder 12, an evaporation source holder 17 installed with an evaporation shutter 15, means for moving the evaporation source holder (not illustrated) and means for producing a low pressure atmosphere. Further, the film forming chamber 11 is installed with a substrate 13 and an evaporation mask 14. Further, alignment of the evaporation mask may be confirmed by using a CCD camera (not illustrated). The evaporation source holder 17 is installed with a container filled with an evaporation material 18. The film forming chamber 11 is vacuumed to a vacuum degree of $5\times10^{-3}$ Torr (0.665 Pa) or lower, preferably, $10^{-4}$ through $10^{-6}$ Pa by the means for producing the low pressure atmosphere.

Further, in evaporation, the evaporation material is previously sublimated (vaporized) by resistance heating and scattered in a direction of the substrate 13 by opening the shutter 15 in evaporation. An evaporated evaporation material 19 is scattered in an upward direction and is selectively vapor-deposited on the substrate 13 by passing an opening portion provided at the evaporation mask 14. Further, preferably, a speed of film formation, a moving speed of the evaporation holder and opening and closing of the shutter are controlled by a control unit such as a personal computer. The evaporation rate of the evaporation source holder can be controlled by the moving speed.

Further, although not illustrated, evaporation can be carried out while measuring a film thickness of a deposited film by a quartz oscillator provided at the film forming chamber 11. When the film thickness of the deposited film is measured by using the quartz oscillator, a change in mass of a film deposited to the quartz oscillator can be measured as a change in the resonance frequency.

In the evaporation system shown in FIGS. 8A to 8C, in evaporation, a distance d of an interval between the substrate 13 and the evaporation source holder 17 can be reduced to, representatively, 30 cm or smaller, preferably, 20 cm or smaller, further preferably, 5 cm through 15 cm to thereby significantly promote an efficiency of utilizing the evaporation material and throughput.

In the evaporation system, the evaporation source holder 17 is constituted by a container (representatively, crucible), a heater arranged on an outer side of the container via a uniformly heating member, an insulating layer provided on an outer side of the heater, an outer cylinder containing these, a cooling pipe wound around an outer side of the outer cylinder and the evaporation shutter 15 for opening and closing an opening portion of the outer cylinder including an opening portion of a crucible. Further, the evaporation source holder 17 may be a container capable of being carried in a state of fixing the heater to the container. Further, the container is formed by a material of a sintered body of BN, a composite sintered body of BN and AlN, quartz or a graphite capable of withstanding high temperature, high pressure and low pressure.

Figure 9A:
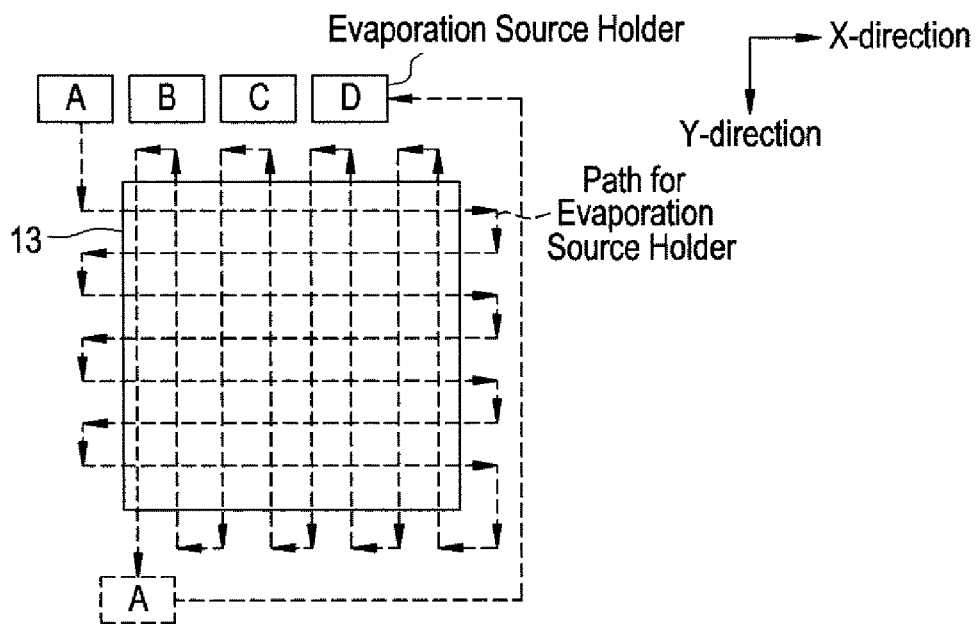
FIGS. 9A and 9B show the evaporation apparatus according to Embodiment 2 of the present invention.
Figure 9B:
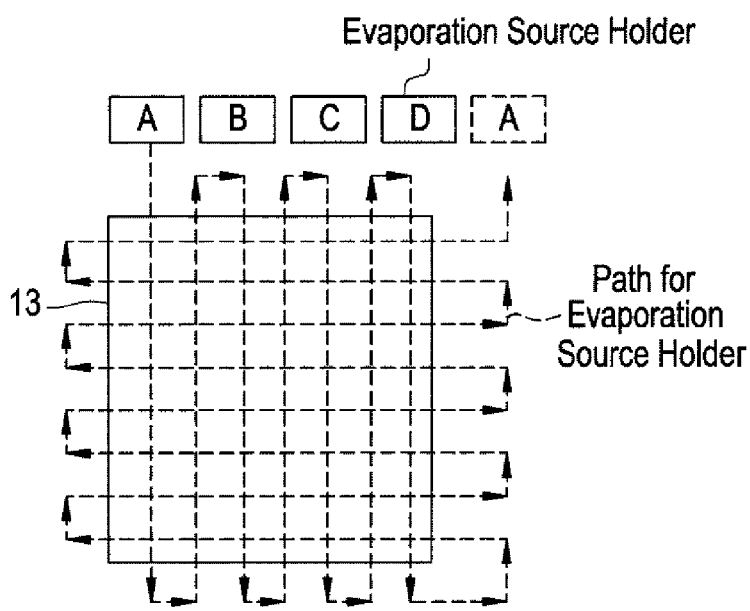

Further, the evaporation source holder 17 is provided with a mechanism movable in X direction or Y direction at inside of the film forming chamber 11 while maintaining a horizontal state. In this case, the evaporation source holder 17 is made to move in zigzag on a two-dimensional plane as shown by FIG. 9A or FIG. 9B. Further, a pitch of moving the evaporation source holder 17 may pertinently be matched to an interval between insulators. Further, insulators 10 are arranged in a stripe shape to cover end portions of first electrodes 21.

Further, in FIGS. 9A and 9B, timings of starting to move the evaporation source holders A, B, C and D may be after stopping or before stopping preceding ones of the evaporation source holders. For example, with setting an organic material capable of hole transporting at the evaporation holder A, an organic material serving as an light emitting layer at the evaporation holder B, an organic material capable of electron transporting at the evaporation holder C and a material serving as a cathode buffer at the evaporation holder D, it is possible to continuously laminate these material layers in a same chamber. Further, when a succeeding one of the evaporation source holder starts moving before solidifying a vapor-deposited film, in an EL layer having a laminated layers structure, a region mixed with evaporation materials (mixed region) may be formed at an interface of respective films.

According to the invention of moving the substrate and the evaporation source holders A, B, C and D relative to each other in this way, small-sized formation of the device can be achieved without needing to prolong a distance between the substrate and the evaporation source holder. Further, since the evaporation system is small-sized, adherence of the sublimated evaporation material to the inner wall or the adherence preventive shield at inside of the film forming chamber is reduced and the evaporation material can be utilized without waste. Further, according to the evaporation method of the invention, it is not necessary to rotate the substrate and therefore, the evaporation system capable of dealing with a large area substrate can be provided. Further, according to the invention of moving the evaporation source holder in the X axis direction and the Y axis direction relative to the substrate, the vapor-deposited film can uniformly be formed.

Further, it is not necessarily needed that an organic compound provided at the evaporation source holder is one or one kind thereof but may be a plurality of kinds thereof. For example, other than one kind of a material provided as a luminescent organic compound at the evaporation source holder, other organic compound which can be a dopant (dopant material) may be provided along therewith. It is preferable to design an organic compound layer to be vapor-deposited to constitute by a host material and a luminescent material (dopant material) having excitation energy lower than that of the host material such that the excitation energy of the dopant becomes lower than excitation energy of a hole transporting region and excitation energy of an electron transporting layer. Thereby, diffusion of a molecular exciter of the dopant can be prevented and the dopant can effectively be made to emit light. Further, when the dopant is a material of a carrier trap type, an efficiency of recombining carriers can also be promoted. Further, the invention includes a case in which a material capable of converting triplet excitation energy to luminescence is added to a mixing region as a dopant. Further, in forming the mixing region, a concentration gradient may be provided to the mixing region.

Further, when a plurality of organic compounds are provided at a single evaporation source holder, it is preferable for evaporating directions to be skew to intersect at a position of an object to be deposited such that the organic compounds are mixed together. Further, in order to carry out common evaporation, the evaporation source holder may be provided with four kinds of evaporation materials (for example, two kinds of host materials as evaporation material A, two kinds of dopant materials as evaporation material b). Further, when a pixel size is small (or, an interval between respective insulators is narrow), a film can finely be formed by dividing inside of a container in four and carrying out common evaporation for subjecting respective pertinently to evaporation.

Further, since the interval distance d between the substrate 13 and the evaporation source holder 17 is narrowed to, representatively, 30 cm or smaller, preferably, 5 cm through 15 cm, there is a concern of heating also the evaporation mask 14. Therefore, it is preferable for the evaporation mask 14 to use a metal material having a low thermal expansion rate which is difficult to deform by heat (for example, a high melting point metal such as tungsten, tantalum, chromium, nickel or molybdenum or an alloy including these elements, a material such as stainless steel, inconel, Hastelloy). For example, a low thermal expansion alloy having 42% of nickel and 58% of iron or the like is pointed out. Further, in order to cool the evaporation mask to be heated, the evaporation mask may be provided with a mechanism of circulating a cooling medium (cooling water, cooling gas).

Further, in order to clean a deposited substance adhered to the mask, it is preferable to generate a plasma at inside of the film forming chamber by plasma generating means to vaporize the deposited substance adhered to the mask to vent the vapor to outside of the film forming chamber. For that purpose, a mask is separately provided with an electrode and a high frequency power source 20 is connected to either one of them.

Further, the film forming chamber includes gas introducing means for introducing one kind or a plurality of kinds of gases selected from the group consisting of Ar, H, F, $NF_3$, and O and venting means for venting the deposited substance vaporized. By the above-described constitution, inside of the film forming chamber can be cleaned without being in contact with the atmosphere in maintenance.

Cleaning can be performed as follows, the atmosphere in a chamber is substituted by nitrogen, and is vacuum exhausted, and a high frequency power supply (13.56 MHz) can be connected with either the mask or the electrode so that a plasma is generated the mask and the electrode (a substrate shutter, not illustrated). Then, argon and hydrogen are introduced to the chamber in respective flow rate of 30 sccm, and the atmosphere in the chamber are stabilized, an RF electric power of 800 W is applied to generate a plasma, thereby the mask and inner wall of the chamber can be cleaned.

Further, the film forming chamber 11 is connected with a vacuuming chamber for vacuuming inside of the film forming chamber. The vacuum processing chamber is provided with a turbo-molecular pump of a magnetic levitation type, a cryopump or a dry pump. Thereby, the ultimate vacuum degree of the film forming chamber 11 can be made to be $10^{-5}$ through $10^{-6}$ Pa and inverse diffusion of an impurity from a pump side and an venting system can be controlled. In order to prevent an impurity from being introduced into the film forming chamber 11, as a gas to be introduced, an inert gas of nitrogen or rare gas is used. There are used the gases to be introduced which are highly purified by a gas refiner before being introduced into the device. Therefore, it is necessary to provide the gas refiner such that the gas is highly purified and thereafter introduced into the film forming chamber 11. Thereby, an impurity of oxygen, water or the like included in the gas can previously be removed and therefore, the impurities can be prevented from being introduced into the film forming chamber 11.

Further, the substrate holder 12 is provided with a permanent magnet for fixing the evaporation mask comprising a metal with the magnetic force and also fixing the substrate 13 interposed therebetween. Although an example of bringing the evaporation mask into close contact with the substrate 13 is shown here, a substrate holder or an evaporation mask holder fixed with an interval to some degree therebetween may pertinently be provided.

According to the film forming chamber having the mechanism of moving the evaporation source holder as described above, it is not necessary to prolong the distance between the substrate and the evaporation source holder and the evaporation film can uniformly be formed.

Embodiment 3

Here, a detailed description will be given of constitutions of a container for filling an evaporation material and an evaporation source holder at a surrounding thereof in reference to FIGS. 10A and 10B as follows. Further, FIGS. 10A and 10B show a state of an open shutter.

Figure 10A:
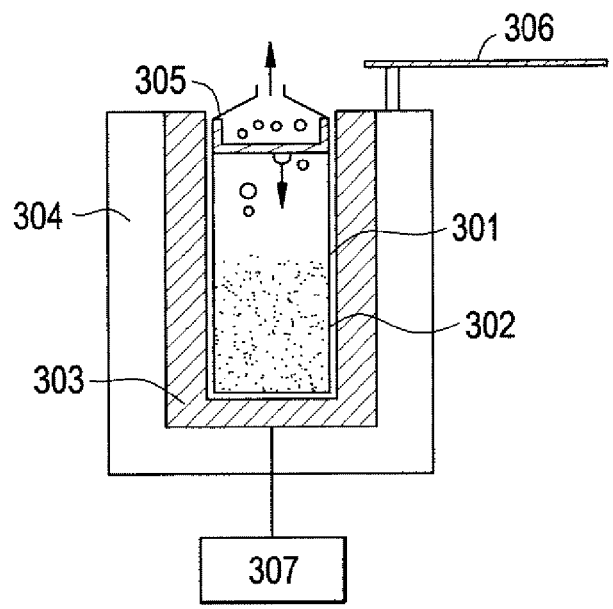
FIGS. 10A and 10B show examples of a container according to Embodiment 3 of the present invention.
Figure 10B:
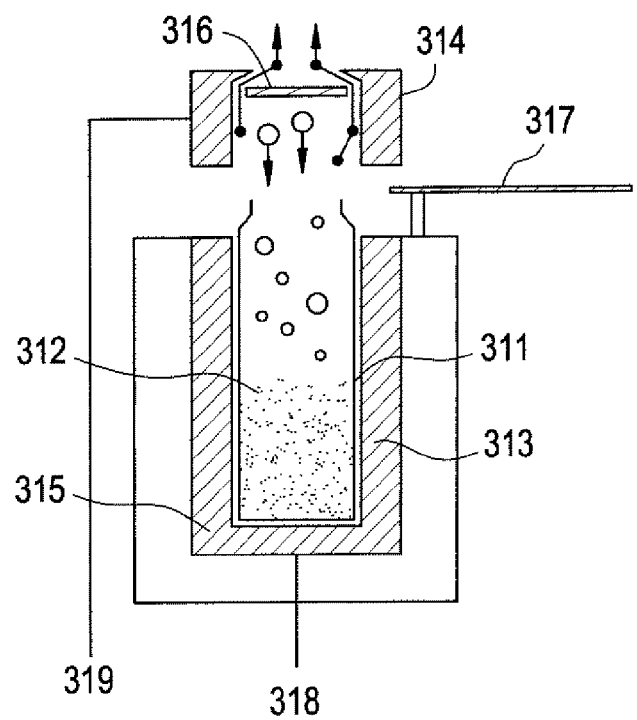

FIG. 10A shows a sectional view of a surrounding of one container installed at an evaporation source holder 304 illustrated with heating means 303 provided at the evaporation source holder, a power source 307 of the heating means, an evaporation material 302 of the container, a filter 305 provided at inside of the container and a shutter 306 arranged above an opening portion provided at an upper portion of the container. As the heating means 303, resistance heating, high frequency or laser may be used, specifically, an electric coil may be used.

Further, the evaporation material 302 heated by the heating means 303 is sublimated and the sublimated material 302 rises upwardly from the opening portion of the container. At this occasion, the sublimated material having a size equal to or larger than a certain constant amount (mesh of filter) cannot pass the filter 305 provided at inside of the container, returns into the container and is sublimated again. Further, the filter 305 may be formed by a highly conductive material and heated by heating means (not illustrated). By the heating, the evaporation material can be prevented from being solidified and adhered to the filter.

By the container having the constitution provided with such a filter, the evaporation material having an even size is vapor-deposited and therefore, a speed of film formation can be controlled and a uniform film thickness can be provided and uniform evaporation without nonuniformity can be carried out. Naturally, when uniform evaporation without nonuniformity can be carried out, it is not necessarily needed to provide a filter. Further, a shape of the container is not limited to that in FIG. 10A.

Next, an explanation will be given of a container filled with an evaporation material having a constitution different from that of FIG. 10A in reference to FIG. 10B.

FIG. 10B is illustrated with a container 311 installed at an evaporation holder, an evaporation material 312 at inside of the container, first heating means 313 provided at the evaporation source holder, a power source 318 of the first heating means, a shutter 317 arranged above an opening portion of the container, a plate 316 provided above the opening portion, second heating means 314 provided to surround the filter and a power source 319 of second heating means.

Further, the evaporation material 312 heated by the first heating means 313 is sublimated and the sublimated evaporation material rises upwardly from the opening portion of the container 311. At this occasion, the sublimated material having a size equal to or larger than a certain constant amount cannot pass an interval between the plate 316 provided above the opening portion of the container and the second heating means 314, impinges on the plate 316 and returns to inside of the container. Further, since the plate 316 is heated by the second heating means 314, the evaporation material can be prevented from solidifying and adhering to the plate 316. Further, it is preferable to form the plate 316 by a highly conductive material. Further, a filter may be provided in place of the plate.

Further, as heating temperature ($T_1$) by the first heating means 313, a temperature higher than a sublimating temperature ($T_A$) of the evaporation material is applied, a heating temperature ($T_2$) by the second heating means 314 may be lower than that of the first heating means. This is because once sublimated evaporation material is easy to sublimate and therefore, the evaporation material is sublimated without applying the actual sublimating temperature. That is, respective heating temperatures may establish $T_1 \gg T_2 > T_A$.

By such a container having a constitution of providing the heating means around the plate, the evaporation material having an even size is sublimated, further, the sublimated material passes a vicinity of the heating means and therefore, adherence of the evaporation material to the plate is reduced, further, the speed of film formation can be controlled and therefore a uniform film thickness can be provided and uniform evaporation without nonuniformity can be carried out. Naturally, when the uniform evaporation without nonuniformity can be carried out, it is not necessarily needed to provide the plate. Further, the shape of the container is not limited to those in FIGS. 10A and 10B but, for example, the container may be provided with shapes as shown by FIGS. 11A and 11B.

Figure 11A:
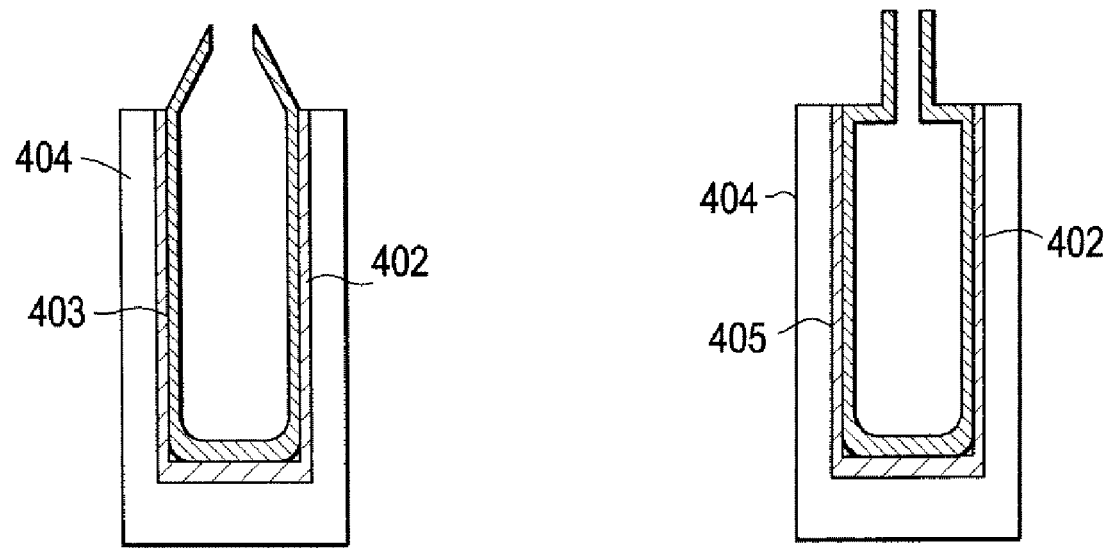
FIGS. 11A and 11B show other examples of the container according to Embodiment 3 of the present invention.

FIG. 11A shows an example of providing heating means 402 at an evaporation source holder 404 illustrating sectional views of examples of shapes of containers 403 and 405 in each of which an opening portion of the container is narrowed toward an upper side thereof. Further, after filling a refined evaporation material in a container having a wide opening portion, the shapes of the container 403 or 405 shown in FIG. 11A may be constituted by using a lid or the like. Further, when a diameter of the opening portion of the container narrowed toward the upper side is constituted by the size of the evaporation material intended to form, an effect similar to that of a filter can be achieved.

Figure 11B:
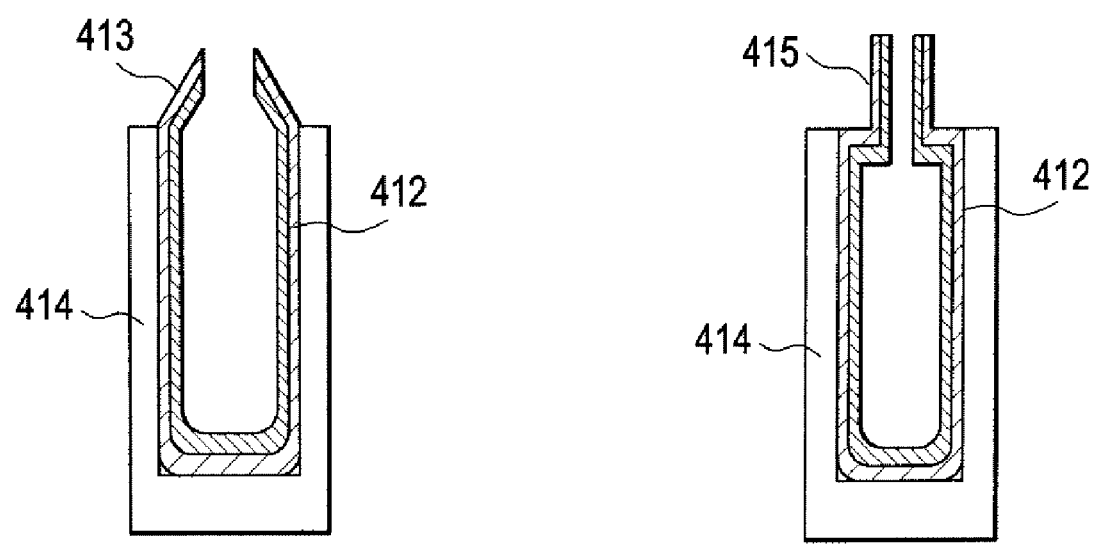

Further, FIG. 11B shows examples of providing heating means 412 at containers. Although shapes of the containers 413 and 415 are similar to those of FIG. 11A, the heating means 412 are provided at the containers per se. Further, power sources of the heating means may be designed to be brought into an ON state at a stage of being installed to evaporation source holders. By such a constitution of providing the heating means at the container per se, heat can be applied sufficiently to an evaporation material even in the case of a container having an opening portion in a shape which is difficult to heat.

Figure 12A:
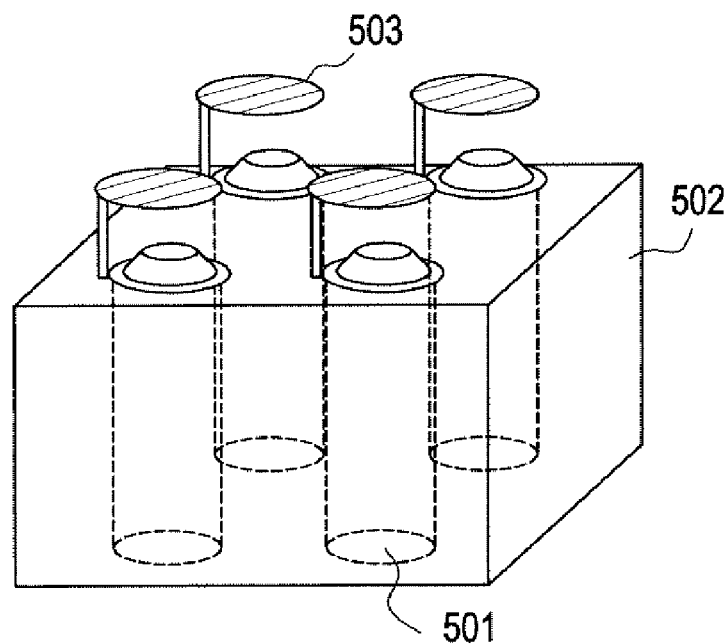
FIGS. 12A and 12B show examples of an evaporation source holder according to Embodiment 3 of the present invention.
Figure 12B:
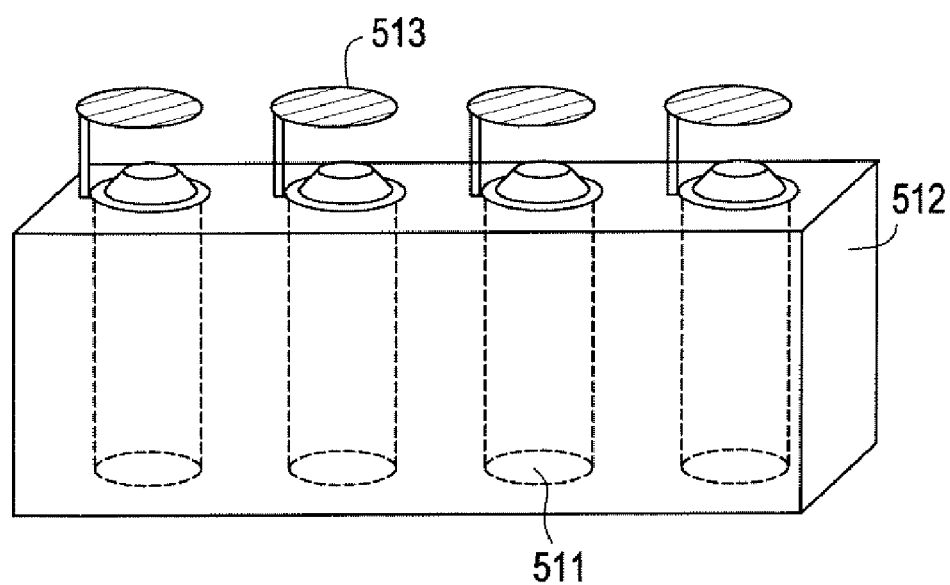

Next, a specific constitution of an evaporation source holder will be explained in reference to FIGS. 12A and 12B. FIGS. 12A and 12B show enlarged views of evaporation source holders.

FIG. 12A shows a constitution example of providing four containers 501 filled with an evaporation material to an evaporation source holder 502 in a shape of a lattice and providing shutters 503 above the respective containers and FIG. 12B shows a constitution example of providing four containers 511 filled with an evaporation material to an evaporation source holder 512 in a linear shape and providing shutters 513 above the respective containers.

A plurality of the containers 501 or 511 filled with the same material may be installed at the evaporation source holder 502 or 512 illustrated in FIG. 12A or 12B or a single one of the container may be installed at the evaporation source holder. Further, common evaporation may be carried out by installing containers filled with different evaporation materials (for example, host material and guest material). Further, as described above, the evaporation material is sublimated by heating the container and a film is formed at the substrate.

Further, as shown by FIG. 12A or 12B, it may be controlled whether the film is formed by the sublimated evaporation material by providing the shutter 503 or 513 above each container. Further, only a single one of the shutter may be provided above all of the containers. Further, by the shutter, it can be reduced to sublimate and scatter an unnecessary evaporation material without stopping to heat the evaporation source holder which does not form the film, that is, the evaporation source holder being at standby. Further, the constitution of the evaporation source holder is not limited to those of FIGS. 12A and 12B but may pertinently be designed by a person for embodying the invention.

By the above-described evaporation source holder and container, the evaporation material can efficiently be sublimated, further, the film is formed in a state in which the size of the evaporation material is even and therefore, a uniform evaporation film without nonuniformity is formed. Further, a plurality of evaporation materials can be installed at the evaporation source holder and therefore, common evaporation can easily be carried out. Further, an aimed EL layer can be formed in one operation without moving the film forming chamber for each film of the EL layer.

Embodiment 4

An explanation will be given, with reference to FIG. 13, of a system of a fabricating method of filling a refined evaporation material in the above-described container, carrying the container and thereafter installing the container directly at an evaporation system which is a film forming device, to carry out evaporation.

Figure 13:
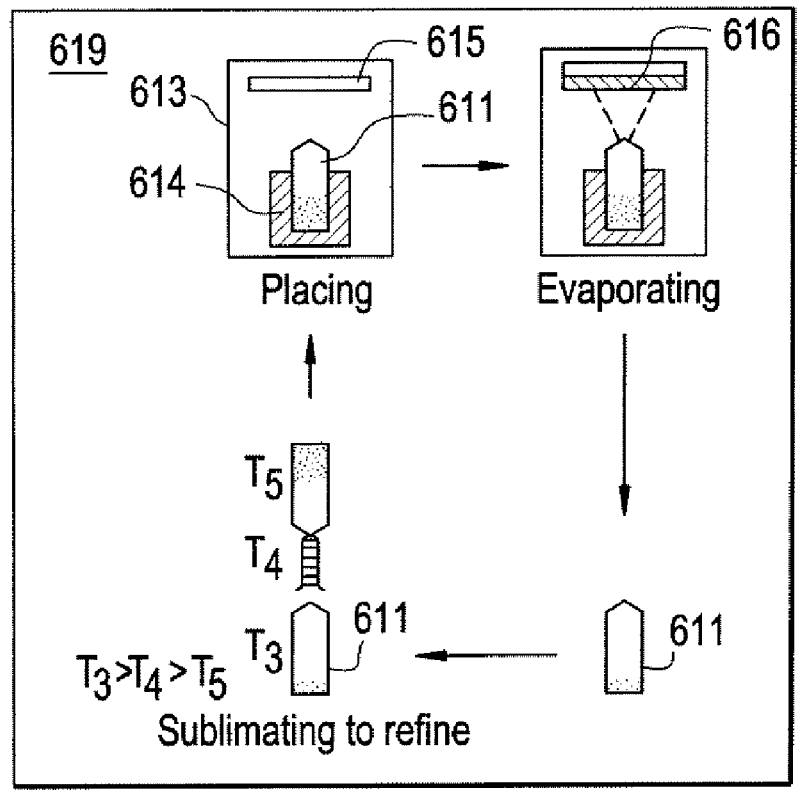
FIG. 13 shows a manufacturing system according to Embodiment 4 of the present invention.

FIG. 13 illustrates a manufacturer, representatively, a material manufacturer 618 (representatively, material manufacturer) for producing and refining an organic compound material which is an evaporation material and a manufacturer (representatively, production factory) 619 of a luminescent device which is a manufacturer of a luminescent device having an evaporation system.

First, an order 610 is carried out from the luminescent device manufacturer 619 to the material manufacturer 618. Based on the order 610, the material manufacturer 618 refines to sublimate an evaporation material and fills an evaporation material 612 in a shape of a powder refined in high purity to a first container 611. Thereafter, the material manufacturer 618 isolates the first container from the atmosphere such that an extra impurity is not adhered to inside or outside thereof, and contains the first container 611 in second containers 621a and 621b to hermetically seal for preventing the first container 611 from being contaminated at inside of the clean environment chamber. In hermetically sealing the second containers 621a and 621b, at inside of the containers it is preferable to be vacuum or to be filled with an inert gas of nitrogen or the like. Further, it is preferable to clean the first container 611 and the second containers 621a and 621b before refining or containing the evaporation material 612 with an ultra high purity. Further, although the second containers 621a and 621b may be package films having barrier performance for blocking oxygen or moisture from mixing thereinto, in order to be able to take out the containers automatically, it is preferable that the second containers are constituted by stout containers having light blocking performance in a shape of a cylinder or a shape of a box.

Thereafter, the first container 611 is carried (617) from the material manufacturer 618 to the luminescent device manufacturer 619 in a state of being hermetically sealed by the second containers 621a and 621b.

At the luminescent device manufacturer 619, the first container 611 is directly introduced into a vacuumable processing chamber 613 in a state of being hermetically sealed in the second containers 621a and 621b. Further, the processing chamber 613 is an evaporation system installed with heating means 614 and substrate holding means (not illustrated) at inside thereof.

Thereafter, inside of the processing chamber 613 is vacuumed to bring about a clean state in which oxygen or moisture is reduced as less as possible, thereafter, without breaking the vacuum, the first container 611 is taken out from the second containers 621a and 621b, the first container 611 is installed in contact with the heating means 614 and an evaporation source can be prepared. Further, an object to be deposited (here, substrate) 615 is installed at the processing chamber 613 to be opposed to the first container 611.

Successively, an evaporation film 616 is formed on a surface of the object to be deposited 615 by applying heat to the evaporation material by the heating means 614. The evaporation film 616 provided in this way does not include an impurity and when a luminescent element is finished by using the evaporation film 616, high reliability and high brightness can be realized.

Further, after forming the film, the evaporation material remaining at the first container 611 may be sublimated to refine at the luminescent device manufacturer 619. After forming the film, the first container 611 is installed at the second containers 621a and 621b, taken out from the processing chamber 613 and carried to a refining chamber for sublimating to refine the evaporation material. There, the remaining evaporation material is sublimated to refine and the evaporation material in a shape of a powder refined at high purity is filled into a separate container. Thereafter, in a state of being hermetically sealed in the second container, the evaporation material is carried to the processing chamber 613 to carry out evaporation processing. At this occasion, it is preferable that a relationship among temperature (T3) for refining the remaining evaporation material, temperature (T4) elevated at a surrounding of the evaporation material and temperature (T5) at a surrounding of the evaporation material which is sublimated to refine satisfy T3>T4>T5. That is, in the case of sublimating to refine the material, when temperature is lowered toward a side of the container for filling the evaporation material to be sublimated to refine, convection is brought about and the material can be sublimated to refine efficiently. Further, the refining chamber for sublimating to refine the evaporation material may be provided in contact with the processing chamber 613 and the evaporation material which has been sublimated to refine may be carried without using the second container for hermetically sealing the evaporation material.

As described above, the first container 611 is installed in the evaporation chamber which is the processing chamber 613 without being brought into contact with the atmosphere at all to enable to carry out evaporation while maintaining the purity at the stage of containing the evaporation material 612 by the material manufacturer. Therefore, according to the invention, a fully automated fabricating system promoting the throughput can be realized and an integrated closed system capable of avoiding the impurity from mixing to the evaporation material 812 refined at the material manufacturer 618 can be realized. Further, the evaporation material 612 is directly contained in the first container 611 by the material matter based on the order and therefore, only a necessary amount thereof is provided to the luminescent device manufacturer and the comparatively expensive evaporation material can efficiently be used. Further, the first container and the second container can be reutilized to amount to a reduction in cost.

Figure 14:
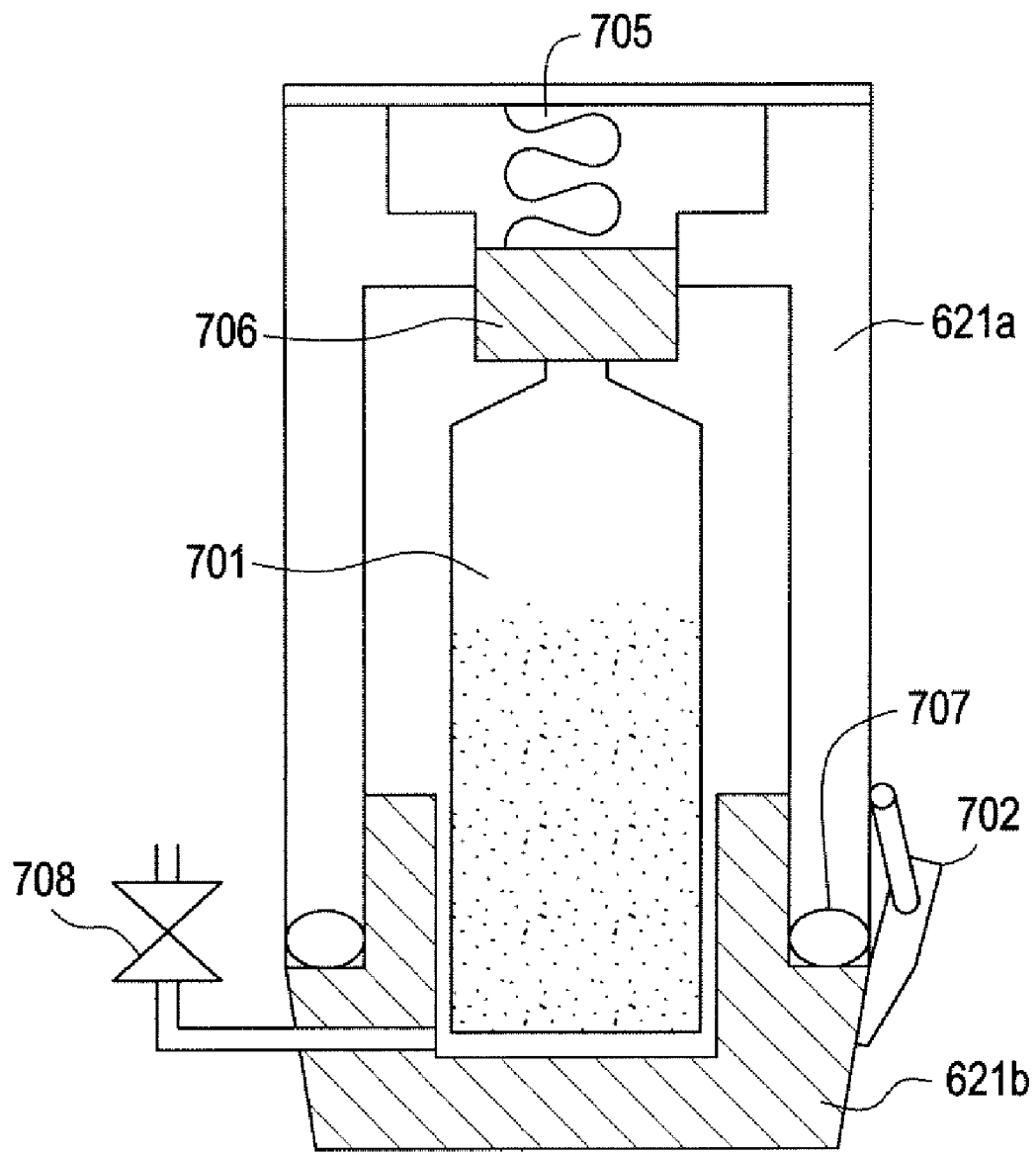
FIG. 14 shows a transfer container according to Embodiment 4 of the present invention.

A specific explanation will be given of a mode of the container to be carried in reference to FIG. 14 as follows. A second container divided into an upper portion (621a) and a lower portion (621b) used for transportation includes fixing means 706 provided at an upper portion of the second container for fixing a first container, a spring 705 for pressing the fixing means, a gas introducing port 708 provided at a lower portion of the second container for constituting a gas path for maintaining the second container being depressurized, an O ring 707 for fixing the upper container 621a and the lower container 621b and a retaining piece 702. The first container 611 filled with the refined evaporation material is installed in the second container. Further, the second container may be formed by a material including stainless steel and the first container may be formed by a material including titanium.

At the material manufacturer, the refined evaporation material is filled in the first container 611. Further, the upper portion 621a and the lower portion 621b of the second container are matched via the O ring 707, the upper container 621a and the lower container 621b are fixed by the retaining piece 702, and the first container 611 is hermetically sealed at inside of the second container. Thereafter, inside of the second container is depressurized via the gas introducing port 708 and is replaced by a nitrogen atmosphere and the first container 611 is fixed by the fixing means 706 by adjusting the spring 705. A desiccant may be installed at inside of the second container. When inside of the second container is maintained in vacuum, in a low pressure or in nitrogen atmosphere in this way, even a small amount of oxygen or water can be prevented from adhering to the evaporation material.

The first container 611 is carried to the luminescent device manufacturer 619 under the state and is directly installed to the processing chamber 613. Thereafter, the evaporation material is sublimated by heating and the evaporation film 616 is formed.

Next, an explanation will be given of a mechanism of installing the first container 611 which is carried by being hermetically sealed in the second container to a film forming chamber 806 in reference to FIGS. 15A and 15B and FIGS. 16A and 16B. Further, FIGS. 15A and 15B and FIGS. 16A and 16B show the first container in the midst of transportation.

Figure 15A:
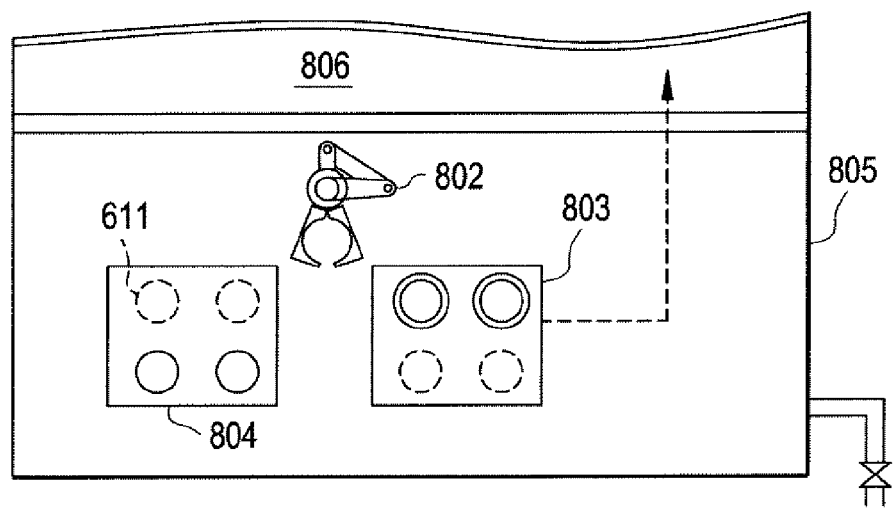
FIGS. 15A and 15B show an evaporation apparatus according to Embodiment 4 of the present invention.
Figure 15B:
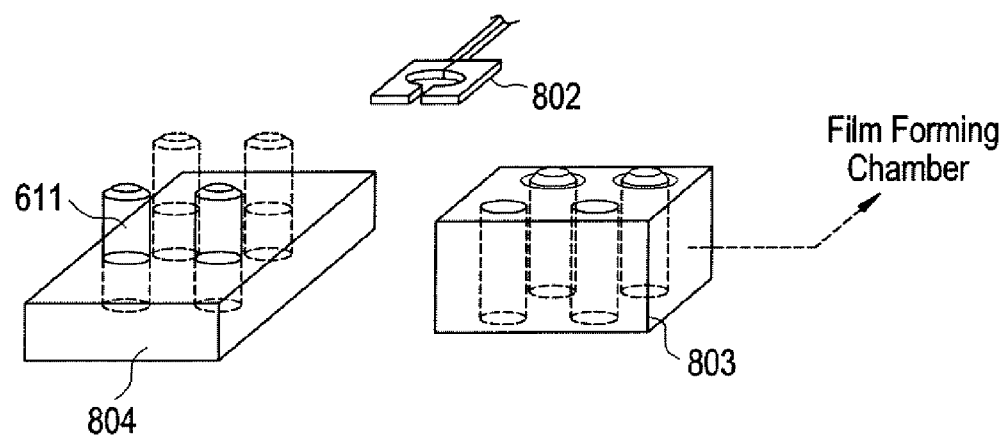

FIG. 15A illustrates to a top view of an installing chamber 805 including a base 804 for mounting the first container or the second container, an evaporation source holder 803, and carrying means 802 for carrying the base 804, the evaporation source holder 803 and the first container, and FIG. 15B illustrates a perspective view of the installing chamber. Further, the installing chamber 805 is arranged to be contiguous to the film forming chamber 806 and the atmosphere of the installing chamber can be controlled by means for controlling the atmosphere via a gas introducing port. Further, the carrying means of the invention is not limited to a constitution of pinching a side face of the first container to carry as illustrated in FIGS. 15A and 15B but may be constructed by a constitution of pinching (picking) the first container at upper part thereof to carry.

The second container is arranged to such an installing chamber 805 above the base 804 in a state of disengaging the retaining piece 702. Successively, inside of the installing chamber 805 is brought into a decompressed state by means for controlling the atmosphere. When pressure at inside of the installing chamber and pressure at inside of the second container become equal to each other, there is brought about a state of being capable of opening the second container easily. Further, the upper portion 621a of the second container is removed and the first container 611 is installed in the evaporation source holder 803 by the carrying means 802. Further, although not illustrated, a portion for installing the removed upper portion 621a is pertinently provided. Further, the evaporation source holder 803 is moved from the installing chamber 805 to the film forming chamber 806.

Thereafter, by heating means provided at the evaporation source holder 803, the evaporation material is sublimated and the film starts to be formed. In forming the film, when a shutter (not illustrated) provided at the evaporation source holder 803 is opened, the sublimated evaporation material is scattered to the direction of the substrate and the vapor-deposited onto the substrate to form the luminescent layer (including hole transporting layer, hole injecting layer, electron transporting layer and electron injecting layer).

Further, after finishing evaporation, the evaporation source holder 803 returns to the installing chamber 805 and the first container 611 installed at the evaporation source holder 803 by the carrying means 802 is transferred to the lower container (not illustrated) of the second container installed at the base 804 and is hermetically sealed by the upper container 621a. At this occasion, it is preferable that the first container, the upper container 621a and the lower container are hermetically sealed by a combination by which the containers have been carried. Under the state, the installing chamber 805 is brought under the atmospheric pressure and the second container is taken out from the installing chamber, fixed with the retaining piece 702 and is carried to the material manufacturer 618.

Next, an explanation will be given of a mechanism of installing a plurality of first containers carried by being hermetically sealed by the second containers to a plurality of the evaporation source holders, which is different from those of FIGS. 15A and 15B in reference to FIGS. 16A and 16B.

Figure 16A:
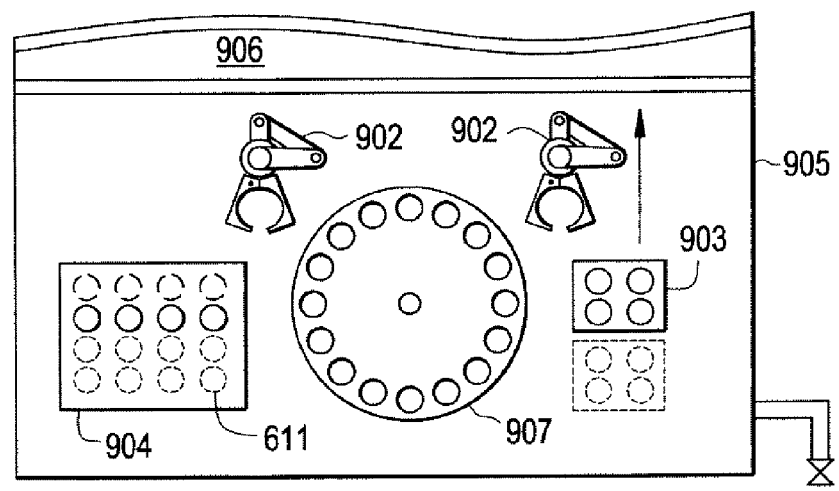
FIGS. 16A and 16B show the evaporation apparatus according to Embodiment 4 of the present invention.
Figure 16B:
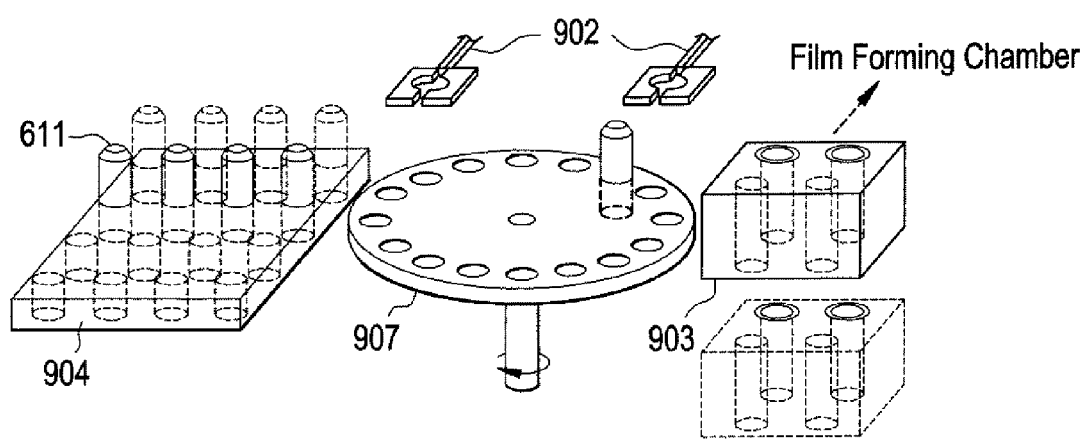

FIG. 16A illustrates a top view of an installing chamber 905 including a base 904 for mounting the first container or the second container, a plurality of evaporation source holders 903, a plurality of carrying means 902 for carrying the first containers and a rotating base 907 and FIG. 16B illustrates a perspective view of the installing chamber 905. Further, the installing chamber 905 is arranged to be contiguous to a film forming chamber 906 and the atmosphere of the installing chamber can be controlled by means for controlling the atmosphere via a gas introducing port.

By the rotating base 907 and the plurality of carrying means 902, operation of installing the plurality of first containers 611 to the plurality of evaporation source holders 903 and transferring the plurality of first containers 611 from the plurality of evaporation source holders finished with film formation to the base 904 can efficiently be carried out. At this occasion, it is preferable to install the first container 611 to the second container which has been carried.

Further, in order to carry the evaporation source holder for starting evaporation and the evaporation source holder finished with evaporation efficiently, the rotating base 907 may be provided with a rotating function. In addition, the structure of the rotating base 907 is not limited to the above one, as far as the rotating base 907 has a function of moving to the right and lift directions, when the rotating base approaches to the evaporation holders arranged in the film forming chamber 906, a plurality of the first containers may be provided at the evaporation holders by the carrying means 902

According to an evaporation film formed by the above-described evaporation system, an impurity can be reduced to an extreme and when a luminescent element is finished by using the evaporation film, high reliability and brightness can be realized. Further, by such a fabricating system, the container filled by the material manufacturer can be installed directly to the evaporation system and therefore, oxygen or water can be prevented from adhering to the evaporation material and further ultrahigh purity formation of the luminescent element in the future can be dealt with. Further, by refining the container having the remaining evaporation material again, waste of the material can be eliminated. Further, the first container and the second container can be reutilized and the low cost formation can be realized.

The present invention constituted by the above structure will be described in more detail with examples shown below.

EXAMPLES

Examples of the present invention are described thereinafter based on the drawings. In addition, in all drawings used for the description of the examples, same portions are given common symbols, and the repetitive descriptions thereof are omitted.

Example 1

In this example, an example of forming TFT on a substrate having an insulating surface and forming an EL element (light emitting element) is shown in FIG. 17. A cross-sectional view of one TFT that is connected to an EL element in a pixel portion is shown in this example.

A base insulating film 201 is formed by a lamination of insulating films such as a silicon oxide film, a silicon nitride film or a silicon oxynitride film on a substrate 200 having an insulating surface. Although the base insulating film 201 herein uses a two-layer structure, it may use a structure having a single layer or two layers or more of the insulating films. The first layer of the base insulating film is a silicon oxynitride film formed to have a thickness of 10 to 200 nm (preferably 50 to 100 nm) by plasma CVD using a reaction gas of $SiH_4$, $NH_3$ and $N_2O$. Herein, a silicon oxynitride film is formed (composition ratio: Si=32%, O=27%, N=24% and H=17%) having a film thickness of 50 nm. The second layer of the base insulating film is a silicon oxynitride film formed to have a thickness 50 to 200 nm (preferably 100 to 150 nm) by plasma CVD using a reaction gas of $SiH_4$ and $N_2O$. Herein, a silicon oxynitride film is formed (composition ratio: Si=32%, O=59%, N=7% and H=2%) having a film thickness of 100 nm.

Subsequently, a semiconductor layer is formed on the base insulating film 201. The semiconductor layer is formed as follows: an amorphous semiconductor film is formed by known means (a sputtering, an LPCVD, a plasma CVD, or the like), then, the film is crystallized by a known crystallization method (a laser crystallization method, a thermal crystallization method or a thermal crystallization method using a catalyst such as nickel), and then, the crystalline semiconductor film is patterned into a desired form. This semiconductor layer is formed in a thickness of 25 to 80 nm (preferably 30 to 60 nm). The material of the crystalline semiconductor film, although not limited in material, is preferably formed of silicon or a silicon-germanium alloy.

In the case of forming a crystalline semiconductor film by a laser crystallizing process, it is possible to use an excimer laser of a pulse-oscillation or continuous-oscillation type, a YAG laser, or an $YVO_4$ laser. In the case of using such laser, preferably used is a method that the laser light emitted from a laser oscillator is condensed by an optical system into a linear form to be irradiated onto the semiconductor film. The condition of crystallization is to be appropriately selected by those who implement the invention. In the case of using an excimer laser, pulse oscillation frequency is 30 Hz and laser energy density is 100 to 400 $mJ/cm^2$ (typically 200 to 300 $mJ/cm^2$). Meanwhile, in the case of using a YAG laser, preferably its second harmonic is used and pulse oscillation frequency is 1 to 10 kHz and laser energy density is 300 to 600 $mJ/cm^2$ (typically 350 to 500 $mJ/cm^2$). The laser light focused linear to a width of 100 to 1000 µm, e.g. 400 µm, is irradiated throughout the substrate entirety, whereupon the overlap ratio of linear laser beam may be taken 50 to 98%.

Then, the surface of the semiconductor layer is cleaned by an etchant containing a hydrogen fluoride, to form a gate insulating film 202 covering the semiconductor layer. The gate insulating film 202 is formed by an insulating film containing silicon having a thickness of 40 to 150 nm by the use of plasma CVD or sputtering. In this example, a silicon oxynitride film is formed (composition ratio: Si=32%, O=59%, N=7% and H=2%) to have a thickness of 115 nm by plasma CVD. Of course, the gate insulating film 202 is not limited to a silicon oxynitride film but may be made in a single layer or a lamination of layers of insulating films containing other form of silicon.

After cleaning the surface of the gate insulating film 202, a gate electrode 210 is formed.

Then, a p-type providing impurity element (such as B), herein, adequate amounts of boron is added to the semiconductor to form a source region 211 and a drain region 212. After the addition of the impurity element, heating process, intense light radiation or laser irradiation is made in order to activate the impurity element. Simultaneously with activation, restoration is possible from the plasma damage to the gate insulating film or from the plasma damage at the interface between the gate insulating film and the semiconductor layer. Particularly, it is extremely effective to irradiate the second harmonic of a YAG laser at a main or back surface thereby activating the impurity element in an atmosphere at room temperature to 300° C. YAG laser is preferable activating means since it requires a few maintenances.

In the subsequent process, after hydrogenation is carried out, an insulator 213a made from an organic or inorganic material (for example, from a photosensitive organic resin) is formed, then, an aluminum nitride film, an aluminum oxynitride film shown as $AlN_xO_y$, or a first protection film 213b made from a silicon nitride film are formed. The film shown as $AlN_xO_y$ is formed by introducing oxygen, nitrogen, or rear gas from the gas inlet system by RF sputtering using a target made of AlN or Al. The content of nitrogen in the $AlN_xO_y$ film may be in the range of at least several atom %, or 2.5 to 47.5 atom %, and the content of oxygen may be in the range of at most 47.5 atom %, preferably, less than 0.01 to 20 atom %. A contact hole is formed therein reaching the source region 211 or drain region 212. Next, a source electrode (wiring) 215 and a drain electrode 214 are formed to complete a TFT (p-channel TFT). This TFT will control the current that is supplied to OLED (Organic Light Emitting Device).

Also, the present invention is not limited to the TFT structure of this example, but, if required, may be in a lightly doped drain (LDD) structure having an LDD region between the channel region and the drain region (or source region). This structure is formed with a region an impurity element is added with light concentration between the channel formation region and the source or drain region formed by adding an impurity element with high concentration, which is called an LDD region. Furthermore, it may be in, what is called, a GOLD (Gate-drain Overlapped LDD) structure arranging an LDD region overlapped with a gate electrode through a gate insulating film. It is preferable that the gate electrode is formed in a lamination structure and etched to have a different taper angle of an upper gate electrode and a lower gate electrode to form an LDD region and a GOLD region in a self-aligning manner using the gate electrode as a mask.

Meanwhile, although explanation herein was by using the p-channel TFT, it is needless to say that an n-channel TFT can be formed by using an n-type impurity element (P, As, etc.) in place of the p-type impurity element.

Though a top gate TFT is described as an example in this example, the present invention can be applied irrespective of TFT's structure. For example, the present invention can be applied to a bottom gate (reverse stagger) TFT and a forward stagger TFT.

Subsequently, in the pixel portion, a first electrode 217 in contact with a connecting electrode in contact with the drain region is arranged in matrix shape. This first electrode 217 serves as an anode or a cathode of the light-emitting element. Then, an insulator (generally referred to as a bank, a partition, a barrier, a mound, or the like) 216 that covers the end portion of the first electrode 217 is formed. For the insulator 216, a photosensitive organic resin is used. In the case of using a negative type photosensitive acrylic resin is used as a material of the insulator 216, for example, the insulator 216 may be preferably prepared such that the upper end portion of the insulator 216 has a curved surface having a first curvature radius and the lower end portion of the insulator has a curved surface having a second curvature radius. Each of the first and second curvature radiuses may be preferably in the range of 0.2 μm to 3 μm. Furthermore, a layer 218 containing an organic compound is formed in the pixel portion, and a second electrode 219 is then formed thereon to complete an EL element. This second electrode 219 serves as a cathode or an anode of the EL element.

The insulator 216 that covers the end portion of the first electrode 217 may be covered with a second protective film formed of an aluminum nitride film, an aluminum nitride oxide film, or a silicon nitride film.

For instance, an example of using a positive type photosensitive acrylic resin as a material of the insulator 216 is shown in FIG. 17B. The insulator 316a has a curved surface having a curvature radius only the upper end thereof. Furthermore, the insulator 316a is covered with a second protective film 316b formed of an aluminum nitride film, an aluminum nitride oxide film, or a silicon nitride film.

For instance, when the first electrode 217 is used as an anode, the material of the first electrode 217 may be a metal (i.e., Pt, Cr, W, Ni, Zn, Sn, or In) having a large work function. The end portion of such an electrode 217 is covered with the insulator (generally referred to as a bank, a partition, a barrier, a mound, or the like) 216 or 316, then, a vacuum-evaporation is carried out moving an evaporation source along with the insulator 216 or 316 by using the evaporation system shown in Embodiments 1 to 3. For example, a film forming chamber is vacuum-exhausted until the degree of vacuum reaches $5 \times 10^{-3}$ Torr (0.665 Pa) or less, preferably $10^{-4}$ to $10^{-6}$ Pa, for vacuum-evaporation. Prior to vacuum-evaporation, the organic compound is vaporized by resistance heating. The vaporized organic compound is scattered on the substrate as the shutter is opened for vacuum-evaporation. The vaporized organic compound is scattered upward, then, deposited on the substrate through an opening formed in a metal mask. A light emitting layer (including a hole transporting layer, a hole injection layer, an electron transporting layer, and an electron injection layer) is formed.

In the case that a layer containing an organic compound is formed that emits white luminescence in its entirety by vacuum-evaporation, it can be formed by depositing each light emitting layer. For instance, an Alq$_3$ film, an Alq$_3$ film partially doped with Nile red which is a red light emitting pigment, a p-EtTAZ film, and a TPD (aromatic diamine) film are layered in this order to obtain white light.

In case of using vacuum-evaporation, as shown in Embodiment 3, a container (typically a melting pot) in which an EL material that a vacuum-evaporation material is stored in advance by a material manufacturer is set in a film forming chamber. Preferably, the melting pot is set in the film forming chamber while avoiding contact with the air. The melting pot shipped from a material manufacturer is preferably sealed in a second container during shipment and is introduced into a film forming chamber in that state. Desirably, a chamber having vacuum exhaust means is connected to the film forming chamber, the melting pot is taken out of the second container in vacuum or in an inert gas atmosphere in this chamber, and then the melting pot is set in the film forming chamber. In this way, the melting pot and the EL material stored in the melting pot are protected from contamination.

The second electrode 219 comprises a laminate structure of a metal (e.g., Li, Mg, or Cs) having a small work function; and a transparent conductive film (made of an indium tin oxide (ITO) alloy, an indium zinc oxide alloy (In$_2$O$_3$—ZnO), zinc oxide (ZnO), or the like) on the thin film. For attaining a low-resistance cathode, an auxiliary electrode may be provided on the insulator 216 or 316. The light-emitting element thus obtained emits white luminescence. Here, the example in which the layer 218 containing the organic compound is formed by vacuum-evaporation has been described. According to the present invention, however, it is not limited to a specific method and the layer 218 may be formed using a coating method (a spin coating method, an ink jet method).

In this example, an example of depositing layers made from low molecular material as an organic compound layer is described though, both high molecular materials and low molecular materials may also be deposited.

It can be thought that there are two types of structures of an active matrix light emitting device having TFT in terms of radiating direction of luminescence. One is a structure that luminescence generated in a light emitting element can be observed passing through the second electrode, and can be manufactured using the above-mentioned steps.

Another structure is that luminescence generated in the light emitting element is irradiated into the eyes of the observer after passing through the first electrode, it is preferable that the first electrode 217 may be prepared using a material having a translucency. For instance, when the first electrode 217 is provided as an anode, a transparent conductive film (made of an indium tin oxide (ITO) alloy, an indium zinc oxide alloy (In$_2$O$_3$—ZnO), zinc oxide (ZnO), or the like) is used for a material of the first electrode 217 and the end portion thereof is covered with the insulator (generally referred to as a bank, a partition, a barrier, a mound, or the like) 216, followed by forming the layer 218 containing an organic compound. On this layer, furthermore, a second electrode 219 formed of a metal film (i.e., an alloy of MgAg, MgIn, AlLi, CaF$_2$, CaN, or the like, or a film formed by a co-vacuum-evaporation of an element of Group I and Group II in the periodic table and aluminum) is formed as a cathode. Here, a resistive heating method using vacuum-evaporation is used for the formation of a cathode, so that the cathode can be selectively formed using a vacuum-evaporation mask.

After forming the second electrode 219 by the steps described above, a seal substrate is laminated using a sealing material to encapsulate the light-emitting element formed on the substrate 200.

Here, an appearance view of an active matrix type light-emitting device is described with reference to FIGS. 18A and 18B. Further, FIG. 18A is a top view showing the light emitting apparatus and FIG. 18B is a sectional view constituted by cutting FIG. 18A by a line A-A'. A source signal side driving circuit 1101, a pixel portion 1102, and a gate signal line driving circuit 1103 are formed on a substrate 1110. An inner side surrounded by a seal substrate 1104, the sealing material 1105, and the substrate 1110 constitutes a space 1107.

Further, a wiring 1108 for transmitting signals inputted to the source signal side driving circuit 1101 and the gate signal side driving circuit 1103 receives a video signal or a clock signal from FPC (flexible printed circuit) 1109 for constituting an external input terminal. Although only FPC is illustrated here, the FPC may be attached with a printed wiring substrate (PWB). The light emitting apparatus in the specification includes not only a main body of the light emitting apparatus but also a state in which FPC or PWB is attached thereto.

Next, a sectional structure will be explained in reference to FIG. 18B. Driver circuits and the pixel portion are formed over a substrate 1110 and here, the source signal line driving circuit 1101 as the driver circuit and the pixel portion 1102 are shown.

Further, the source signal line driving circuit 1101 is formed with a CMOS circuit combined with an n-channel type TFT 1123 and a p-channel type TFT 1124. Further, TFT for forming the driver circuit may be formed by a publicly-known CMOS circuit, PMOS circuit or NMOS circuit. Further, although according to this example, a driver integrated type formed with the driver circuits over the substrate is shown, the driver integrated type is not necessarily be needed and the driver circuits can be formed not over the substrate but at outside thereof.

Further, the pixel portion 1102 is formed of a plurality of pixels each including a switching TFT 1111, a current controlling TFT 1112, and a first electrode (anode) 1113 electrically connected to a drain of the current controlling TFT 1112.

Further, an insulating layer 1114 is formed at both ends of the first electrode (anode) 1113 and an organic compound layer 1115 is formed on the first electrode (anode) 1113. The organic compound layer 1115 is formed by moving an evaporation source along with the insulating film 1114 by using the device shown in Embodiments 1 and 2. Further, a second electrode (cathode) 1116 is formed over the organic compound layer 1115. As a result, a light-emitting element 1118 comprising the first electrode (anode) 1112, the organic compound layer 1115 and the second electrode (cathode) 1116 is formed. Here, the light-emitting element 1118 shows an example of white color luminescence and therefore, provided with the color filter comprising a coloring layer 1131 and a light-shielding layer 1132 (for simplification, overcoat layer is not illustrated here).

In FIGS. 19A to 19C, a color filter is formed at the side of a seal substrate 1104 since it is the structure that light emitted from a light emitting element is observed through the second electrode, however, in case of the structure that light emitted from a light emitting element is observed through the first electrode, a color filter is formed at the side of the substrate 1110.

The second electrode (cathode) 1116 functions also as a wiring common to all the pixels and electrically connected to FPC 1109 via the connection wiring 1108. The third electrode (auxiliary electrode) 1117 is formed on the insulating layer 1114 to realize to make the second electrode have a low resistance.

Further, in order to encapsulate the light-emitting element 1118 formed over the substrate 1110, the seal substrate 1104 is pasted by the sealing material 1105. Further, a spacer comprising a resin film may be provided for ensuring an interval between the seal substrate 1104 and the light-emitting element 1118. Further, the space 1107 on the inner side of the sealing material 1105 is filled with an inert gas of nitrogen or the like. Further, it is preferable to use epoxy species resin for the sealing material 1105. Further, it is preferable that the sealing material 1105 is a material for permeating moisture or oxygen as less as possible. Further, the inner portion of the space 1107 may be included with the substance having an effect of absorbing oxygen or moisture.

Further, according to the example, as a material for constituting the seal substrate 1104, other than glass substrate or quartz substrate, a plastic substrate comprising FRP (Fiberglass-Reinforced Plastics), PVF (polyvinyl fluoride), Mylar, polyester or acrylic resin can be used. Further, it is possible to adhere the seal substrate 1104 by using the sealing material 1105 and thereafter seal to cover a side face (exposed face) by a sealing material.

By encapsulating the light-emitting element as described above, the light-emitting element can completely be blocked from outside and a substance for expediting to deteriorate the organic compound layer such as moisture or oxygen can be prevented from invading from outside. Therefore, the highly reliable light-emitting device can be provided.

Further, this example can be freely combined with Embodiments 1 to 4.

Example 2

Given as examples of electronic apparatuses that employ the light emitting device manufactured in accordance with the present invention are video cameras, digital cameras, goggle type displays (head mounted displays), navigation systems, audio reproducing devices (such as car audio and audio components), laptop computers, game machines, portable information terminals (such as mobile computers, cellular phones, portable game machines, and electronic books), and image reproducing devices equipped with recording media (specifically, devices with a display device that can reproduce data in a recording medium such as a digital versatile disk (DVD) to display an image of the data). A wide viewing angle is important particularly for portable information terminals because their screens are often slanted when they are looked at. Therefore it is preferable for portable information terminals to employ the light emitting device using the light emitting element. Specific examples of these electronic apparatuses are shown in FIGS. 20A to 20H.

Figure 20A:
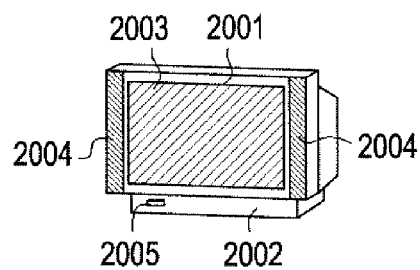
FIGS. 20A to 20H each show an example of electronic equipment using the present invention.

FIG. 20A shows a light emitting device including a case 2001, a support base 2002, a display unit 2003, speaker units 2004, a video input terminal 2005, etc. The light emitting device manufactured in accordance with the present invention can be applied to the display unit 2003. In addition, the light emitting device shown in FIG. 20A can be completed by the present invention. Since the light emitting device having the light emitting element is of self-luminous type, the device does not need a backlight and can make a thinner display unit than that of a liquid crystal display device. The light emitting device refers to all light emitting devices for displaying information, including ones for personal computers, for TV broadcasting reception, and for advertisement.

Figure 20B:
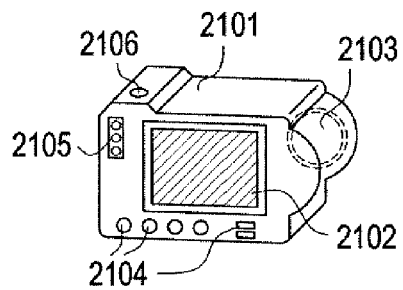

FIG. 20B shows a digital still camera including a main body 2101, a display unit 2102, an image receiving unit 2103, operation keys 2104, an external connection port 2105, a shutter 2106, etc. The light emitting device manufactured in accordance with the present invention can be applied to the display unit 2102. The digital camera shown in FIG. 16B can be completed by the present invention.

Figure 20C:
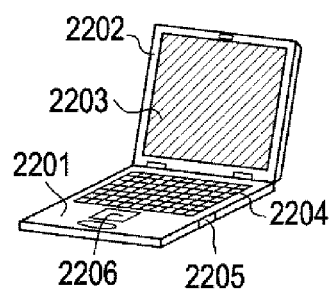

FIG. 20C shows a laptop computer including a main body 2201, a case 2202, a display unit 2203, a keyboard 2204, an external connection port 2205, a pointing mouse 2206, etc. The light emitting device manufactured in accordance with the present invention can be applied to the display unit 2203. The laptop computer shown in FIG. 20C can be completed by the present invention.

Figure 20D:
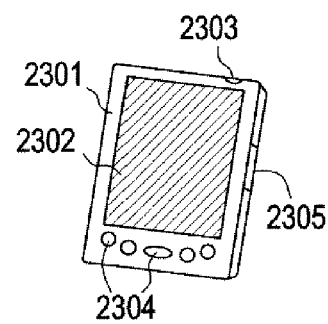

FIG. 20D shows a mobile computer including a main body 2301, a display unit 2302, a switch 2303, operation keys 2304, an infrared port 2305, etc. The light emitting device manufactured in accordance with the present invention can be applied to the display unit 2302. The mobile computer shown in FIG. 20D can be completed by the present invention.

Figure 20E:
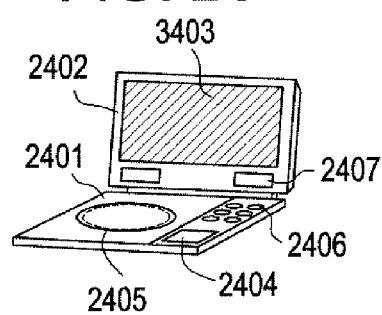

FIG. 20E shows a portable image reproducing device equipped with a recording medium (a DVD player, to be specific). The device includes a main body 2401, a case 2402, a display unit A 2403, a display unit B 2404, a recording medium (DVD or the like) reading unit 2405, operation keys 2406, speaker units 2407, etc. The display unit A 2403 mainly displays image information whereas the display unit B 2404 mainly displays text information. The light emitting device manufactured in accordance with the present invention can be applied to the display units A 2403 and B 2404. The image reproducing device equipped with a recording medium also includes home-video game machines. The DVD player shown in FIG. 20E can be completed by the present invention.

Figure 20F:
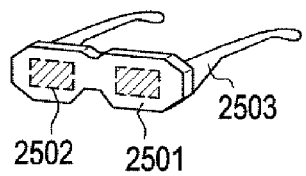

FIG. 20F shows a goggle type display (head mounted display) including a main body 2501, display units 2502, and arm units 2503. The light emitting device manufactured in accordance with the present invention can be applied to the display units 2502. The goggle type display shown in FIG. 20F can be completed by the present invention.

Figure 20G:
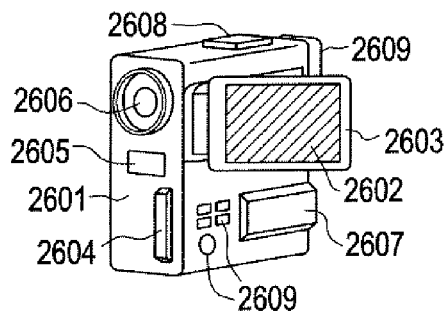

FIG. 20G shows a video camera including a main body 2601, a display unit 2602, a case 2603, an external connection port 2604, a remote control receiving unit 2605, an image receiving unit 2606, a battery 2607, an audio input unit 2608, operation keys 2609 etc. The light emitting device manufactured in accordance with the present invention can be applied to the display unit 2602. The video camera shown in FIG. 20G can be completed by the present invention.

Figure 20H:
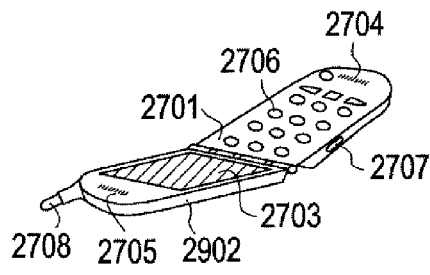

FIG. 20H shows a cellular phone including a main body 2701, a case 2702, a display unit 2703, an audio input unit 2704, an audio output unit 2705, operation keys 2706, an external connection port 2707, an antenna 2708, etc. The light emitting device manufactured in accordance with the present invention can be applied to the display unit 2703. If the display unit 2703 displays white letters on a black background, the cellular phone consumes less power. The cellular phone shown in FIG. 20H can be completed by the present invention.

If a brighter luminance of luminescence materials becomes valuable in the future, the light emitting device can be used in front or rear projectors by enlarging outputted light that contains image information through a lens or the like and projecting the light.

These electronic apparatuses now display with increasing frequency information sent through electronic communication lines such as the Internet and CATV (cable television), especially, animation information. Since the luminescence materials have very fast response speed, the light emitting device is suitable for moving images.

According to the present invention, there can be provided a manufacturing apparatus including the plural film forming chambers for performing the evaporation process, which are arranged in a row. Accordingly, the film forming processes are performed in the plural film forming chambers approximately in parallel, thereby improving the throughput of the light emitting device and allowing the reduction of a processing time per substrate.

Further, according to the present invention, even though the processing number of substrates is slightly reduced, the maintenance of one or plural film forming chambers is possible without temporarily stopping the production line.

What is claimed is:

1. A method of fabricating light emitting devices by using an evaporation system including a plurality of first deposition chambers for forming a film of an organic compound layer and a plurality of second deposition chambers for forming a conductive film, said method comprising the steps of:
   forming a first organic compound layer over a first substrate in one of the plurality of first deposition chambers;
   forming a second organic compound layer over a second substrate in another of the plurality of first deposition chambers;
   after forming the first organic compound layer, moving the first substrate from the one of the plurality of first deposition chambers to one of the plurality of second deposition chamber by using a carrying means without being exposed to an atmosphere;
   moving the second substrate from the another of the plurality of first deposition chambers to another of the plurality of second deposition chambers by using the carrying means without being exposed to an atmosphere after the first substrate is moved from the one of the plurality of first deposition chambers;
   forming a first conductive film in contact with the first organic compound layer in the one of the plurality of second deposition chambers; and
   forming a second conductive film in contact with the second organic compound layer in the another of the plurality of second deposition chambers,
   wherein the first organic compound layer and the second organic compound layer are formed approximately in parallel.

2. The method of fabricating light emitting devices according to claim 1, wherein the first conductive film and the second conductive film are formed approximately in parallel.

3. The method of fabricating light emitting devices according to claim 1,
   wherein the first organic compound layer comprises a first hole transporting layer, a first light emitting layer and a first electron transporting layer, and
   wherein the second organic compound layer comprises a second hole transporting layer, a second light emitting layer and a second electron transporting layer.

4. The method of fabricating light emitting devices according to claim 3, wherein each of the first light emitting layer and the second light emitting layer is formed by laminating a plurality of layers which emit different colors.

5. The method of fabricating light emitting devices according to claim 3, wherein each of the first light emitting layer and the second light emitting layer is formed by laminating a first layer which emits blue on a second layer which emits yellow.

6. The method of fabricating light emitting devices according to claim 3, wherein each of the first light emitting layer and the second light emitting layer emits white light.

7. A method of fabricating light emitting devices by using an evaporation system including a plurality of first deposition chambers for forming a film of an organic compound layer, a plurality of second deposition chambers for forming a conductive film and a plurality of third deposition chambers for forming a protective film, said method comprising the steps of:
   forming a first organic compound layer over a first substrate in one of the plurality of first deposition chambers;
   forming a second organic compound layer over a second substrate in another of the plurality of first deposition chambers;
   after forming the first organic compound layer, moving the first substrate from the one of the plurality of first deposition chambers to one of the plurality of second deposition chambers by using a first carrying means without being exposed to an atmosphere;

moving the second substrate from the another of the plurality of first deposition chambers to another of the plurality of second deposition chambers by using the first carrying means without being exposed to an atmosphere after the first substrate is moved from the one of the plurality of first deposition chambers;

forming a first conductive film in contact with the first organic compound layer in the one of the plurality of second deposition chambers;

forming a second conductive film in contact with the second organic compound layer in the another of the plurality of second deposition chambers;

moving the first substrate from the one of the plurality of second deposition chambers to one of the plurality of third deposition chambers by using a second carrying means without being exposed to an atmosphere after the first conductive film is formed;

moving the second substrate from the another of the plurality of second deposition chambers to another of the plurality of third deposition chambers by using the second carrying means without being exposed to an atmosphere after the first substrate is moved from the one of the plurality of second deposition chambers to the one of the plurality of third deposition chambers;

forming a first protective film over the first conductive film in the one of the plurality of third deposition chambers; and forming a second protective film over the second conductive film in the another of the plurality of third deposition chambers, wherein the first organic compound layer and the second organic compound layer are formed approximately in parallel, and wherein the first conductive film and the second conductive film are formed approximately in parallel.

8. The method of fabricating light emitting devices according to claim 7, wherein the first protective film and the second protective film are formed approximately in parallel.

9. The method of fabricating light emitting devices according to claim 7, wherein the first organic compound layer comprises a first hole transporting layer, a first light emitting layer and a first electron transporting layer, and wherein the second organic compound layer comprises a second hole transporting layer, a second light emitting layer and a second electron transporting layer.

10. The method of fabricating light emitting devices according to claim 9, wherein each of the first light emitting layer and the second light emitting layer is formed by laminating a plurality of layers which emit different colors.

11. The method of fabricating light emitting devices according to claim 7, wherein each of the first light emitting layer and the second light emitting layer is formed by laminating a first layer which emits blue on a second layer which emits yellow.

12. The method of fabricating light emitting devices according to claim 9, wherein each of the first light emitting layer and the second light emitting layer emits white light.

* * * * *

UNITED STATES PATENT AND TRADEMARK OFFICE
CERTIFICATE OF CORRECTION

PATENT NO. : 8,110,509 B2  
APPLICATION NO. : 12/203802  
DATED : February 7, 2012  
INVENTOR(S) : Shunpei Yamazaki et al.

Page 1 of 1

It is certified that error appears in the above-identified patent and that said Letters Patent is hereby corrected as shown below:

In the Claims,

Column 30, lines 14-15 (Claim 1, lines 13-14) "second deposition chamber by using" should read "second deposition chambers by using"

Column 32, line 23 (Claim 11, line 2) "according to claim 7" should read "according to claim 9"

Signed and Sealed this  
Seventeenth Day of July, 2012

David J. Kappos  
*Director of the United States Patent and Trademark Office*